US008328396B2

(12) United States Patent
Capasso et al.

(10) Patent No.: US 8,328,396 B2
(45) Date of Patent: Dec. 11, 2012

(54) METHODS AND APPARATUS FOR IMPROVING COLLIMATION OF RADIATION BEAMS

(75) Inventors: Federico Capasso, Cambridge, MA (US); Nanfang Yu, Cambridge, MA (US); Jonathan Fan, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 393 days.

(21) Appl. No.: 12/738,180

(22) PCT Filed: Nov. 19, 2008

(86) PCT No.: PCT/US2008/084068
§ 371 (c)(1),
(2), (4) Date: Apr. 15, 2010

(87) PCT Pub. No.: WO2009/067540
PCT Pub. Date: May 28, 2009

(65) Prior Publication Data
US 2010/0226134 A1    Sep. 9, 2010

Related U.S. Application Data

(60) Provisional application No. 60/988,935, filed on Nov. 19, 2007.

(51) Int. Cl.
*F21V 33/00* (2006.01)
(52) U.S. Cl. .............. 362/311.12; 359/641; 359/738
(58) Field of Classification Search .......... 362/311.12; 359/641, 738, 707, 720
See application file for complete search history.

(56) References Cited

U.S. PATENT DOCUMENTS

| 6,834,027 | B1 | 12/2004 | Sakaguchi et al. |
| 7,057,151 | B2* | 6/2006 | Lezec et al. ............... 250/216 |
| 2004/0190116 | A1 | 9/2004 | Lezec et al. |
| 2005/0161589 | A1 | 7/2005 | Kim et al. |
| 2010/0110430 | A1* | 5/2010 | Ebbesen et al. ........... 356/331 |

OTHER PUBLICATIONS

Dayal, P. B., et al., "Polarization control of 0.85 μm vertical-cavity surface-emitting lasers integrated with gold nanorod arrays", 91 Applied Physics Letters 111107 (Sep. 12, 2007).
Lezec, H. J. et al., "Beaming Light from a Subwavelength Aperture", 297 Science Express 820-822 (Aug. 2, 2002).
United States Patent and Trademark Office, International Search Report for Application No. PCT/US2008/084068 (Feb. 2, 2009).
United States Patent and Trademark Office, PCT Written Opinion for Application No. PCT/US2008/084068 (Feb. 2, 2009).
Yu, Nanfang, et al., "Quantum cascade lasers with integrated plasmonic antenna-array collimators", 16 Optics Express 19447-461 (Sep. 21, 2008).
Yu, Nanfang, et al., "Small-divergence semiconductor lasers by plasmonic collimation", 2 Nature Photonics 564-570 (Jul. 27, 2008).

* cited by examiner

*Primary Examiner* — Laura Tso
(74) *Attorney, Agent, or Firm* — Modern Times Legal; Robert J. Sayre

(57) ABSTRACT

An apparatus for collimating radiation can include an aperture of subwavelength dimensions and a neighboring set of grooves defined on a metal film integrated with an active or passive device that emits radiation. Integration of the beam collimator onto the facet of a laser or other radiation-emitting device provides for beam collimation and polarization selection. Beam divergence can be reduced by more than one order of magnitude compared with the output of a conventional laser. An active beam collimator with an aperture-groove structure can be integrated with a wide range of optical devices, such as semiconductor lasers (e.g., quantum cascade lasers), light emitting diodes, optical fibers, and fiber lasers.

19 Claims, 22 Drawing Sheets

METHODS AND APPARATUS FOR IMPROVING COLLIMATION OF RADIATION BEAMS

GOVERNMENT SPONSORED RESEARCH

Some of the research relating to the subject matter disclosed herein was sponsored by the Air Force Office of Scientific Research under Contract No. FA9550-04-1-0434, and the United States government has certain rights to some disclosed subject matter.

BACKGROUND

Beam-collimated radiation sources are desirable for many applications such as pointing (e.g., laser pointers), free-space optical communication or remote sensing, where light needs to be concentrated in a small angle in the far field. Collimated light sources are also important for applications, such as interconnections in optical communication systems, where a laser output is coupled into optical fibers and waveguides. Collimation of light sources is conventionally conducted externally using bulky and usually expensive optical components, such as lenses, or parabolic mirrors. Herein, collimation is defined as low divergence (e.g., a few degrees or less), which for semiconductor lasers includes a divergence angle substantially less than the value of the original devices without collimation (e.g., ten to a few tens of degrees). Because collimated sources provide output beams with low divergence, such sources generally do not require additional collimation lenses and meticulous optical alignment to achieve a desired beam profile and/or directionality. In situations where super-collimated beams (e.g., divergence angle much smaller than 1 degree) are required, low numerical-aperture (NA) lenses may still be used for the collimated sources, which is a cost-effective solution compared with directly using high NA lenses.

For many conventional light sources, the spatial profile of their radiation has an intrinsically large divergence angle. For example, radiation from the p-n junction of a light-emitting diode (LED) is almost isotropic inside the device. If one considers the effect of waveguiding and device-encapsulation on the light output, the divergence angle of LEDs is still very large (e.g., at least tens of degrees). For edge-emitting semiconductor lasers, the divergence angle in the material growth direction is typically large (e.g., tens of degrees). This is because the size of the laser waveguide in the material growth direction, w, is usually comparable to or even smaller than the laser wavelength in the free space, $\lambda_o$. When laser radiation propagates from such a confined waveguide to the free space, it diffracts into an angle that can be roughly estimated by $\lambda_o/w$, yielding a divergence angle on the order of 1 radian or about 60 degrees. Among semiconductor lasers, vertical-cavity surface-emitting lasers (VCSELs) are considered to be superior in beam collimation because they usually have much larger emission area compared to edge-emitting lasers. Commercial VCSELs have a divergence angle ranging from 5 to 30 degrees, but typically about 15 degrees. However, despite the smaller divergence angle achieved by VCSELs, they have an intrinsic problem of unstable output polarization.

Previously, Lezec, et al., proposed and demonstrated a passive aperture-groove structure that was capable of collimating incident visible light [H. J. Lezec, et al., "Beaming light from a sub-wavelength aperture", Science 297, 820 (2002)]. The aperture-groove structure was defined on a suspended metal film and included a central aperture that was surrounded by periodic grooves. Lezec's results showed that a properly designed passive aperture-groove structure could have high power throughput and that the beam emerging from the structure could have a small divergence angle. These results, however, may be viewed as counter-intuitive, as wave optics suggest that light emerging from a subwavelength aperture should be essentially isotropic in the half space and that the transmission efficiency of a single subwavelength aperture should be proportional to $(r/\lambda_o)^4 \ll 1$, where r is the size of the aperture [H. A. Bethe, "Theory of diffraction by small holes" Phys. Rev. 66, 163 (1944)].

The beam-collimation phenomenon of Lezec's work can be understood as follows. The light coming out of the aperture couples into surface plasmons propagating along the grating. Surface plasmons are surface electromagnetic waves that are confined to and propagate along the interface between a metal and a dielectric. These surface plasmons are scattered into free space by the periodic grating grooves. The direct emission from the aperture and the reemissions originated from the scattering of the surface plasmons constructively interfere with each other, giving rise to a collimated beam in the far field.

SUMMARY

The inventors have recognized and appreciated that the radiation emission characteristics of many conventional photonic devices can be significantly improved with respect to beam collimation. More specifically, the inventors have recognized the utility in adapting and integrating an aperture-groove structure, termed a plasmonic collimator, with an active photonic device or other radiation-emitting devices to produce a collimated radiation beam with reduced divergence and a similar level of power throughput compared to previous systems. Suitable metallic structures with subwavelength features can be effectively exploited to directly design the far-field of semiconductor lasers and in particular to greatly reduce their beam divergence. Wavefront engineering of laser beams using plasmonic structures or more generally photonic crystals can have far-reaching implications for future developments in laser science and technology.

In view of the foregoing, the present disclosure is directed generally to methods and apparatus for improving collimation of device radiation. In exemplary embodiments, described herein, a variety of conventional active and passive optical devices are integrated with various aperture-groove structures that are configured to improve collimation of a radiation emitted from the optical device. In various exemplary implementations, so as to significantly increase the collimation effect, the inventors have appreciated that the arrangement (e.g., orientation, spacing, number, etc.) and dimensions of the metallic structures (e.g., aperture, grooves, etc.) can be tailored for use with a particular optical device and desired output parameters (e.g., wavelength, direction, divergence, etc.). As such, exemplary embodiments described herein demonstrate suitable aperture-groove arrangements for integration with a variety of conventional optical devices to provide improved devices with increased beam collimation.

The inventors also have appreciated the challenge of manipulating light at the subwavelength scale in the near field to realize beam collimation in the far field. Accordingly, various concepts, disclosed herein, provide a substantial modification to traditional beam collimation approaches. The physical principles underlying the aperture-groove structure provides considerable flexibility in applying the disclosed technology to a myriad of optical systems. For example, a wide range of applications, from polarization-controllable vertical-cavity surface-emitting lasers to low-divergence light-emitting diodes to coupler-free optical fibers can be achieved by virtue of the methods and apparatus disclosed herein. In one exemplary embodiment described in greater detail below, incorporation of an aperture-groove structure onto the facet of a quantum cascade laser results in an output beam with a divergence angle that is more than one order of magnitude smaller than that from an unmodified quantum cascade laser. The reduction of beam divergence can be achieved either in one dimension (i.e., parallel to the material growth direction of the device) or in two dimensions (i.e., both parallel and perpendicular to the material growth direction). The power throughput of the device with the aperture-groove structure is comparable to that of the unmodified quantum cascade laser.

Additional benefits that can be provided by this structure include the absence of any need for alignment where the plasmonic collimator is integrated with the light source. Additionally, by scaling the plasmonic collimator design, the collimator can fit onto any type of light sources with a wide range of emitting wavelengths from the visible to the far-infrared. Further still, the plasmonic collimator can essentially control the beam divergence in two orthogonal directions, which is helpful for some applications where a collimated beam with circular cross section is required to reduce aberration along the optical path.

The term "light source" should be understood to refer to any one or more of a variety of active or passive radiation-emitting devices, including, but not limited to, various incoherent light sources (e.g., light-emitting diodes), various types of lasers, optical fibers, etc. A given light source may be configured to generate electromagnetic radiation within the visible spectrum, outside the visible spectrum, or a combination of both. Hence, the terms "light" and "radiation" are used interchangeably herein.

It should be appreciated that all combinations of the foregoing concepts and additional concepts discussed in greater detail below are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

29. It is assumed that the laser wavelength is 9.9 µm and that there are 55 slit apertures on the outer metal layer (not all are shown in the figure).

Figure 30:
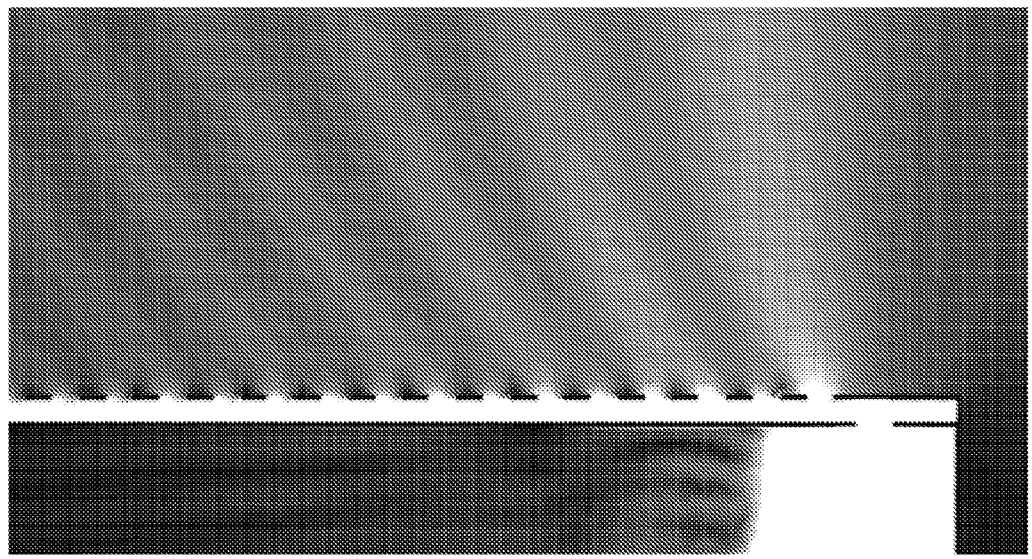
FIG. 30 illustrates the simulation result of the intensity distribution around the plasmonic collimator shown in FIG.
Figure 31:
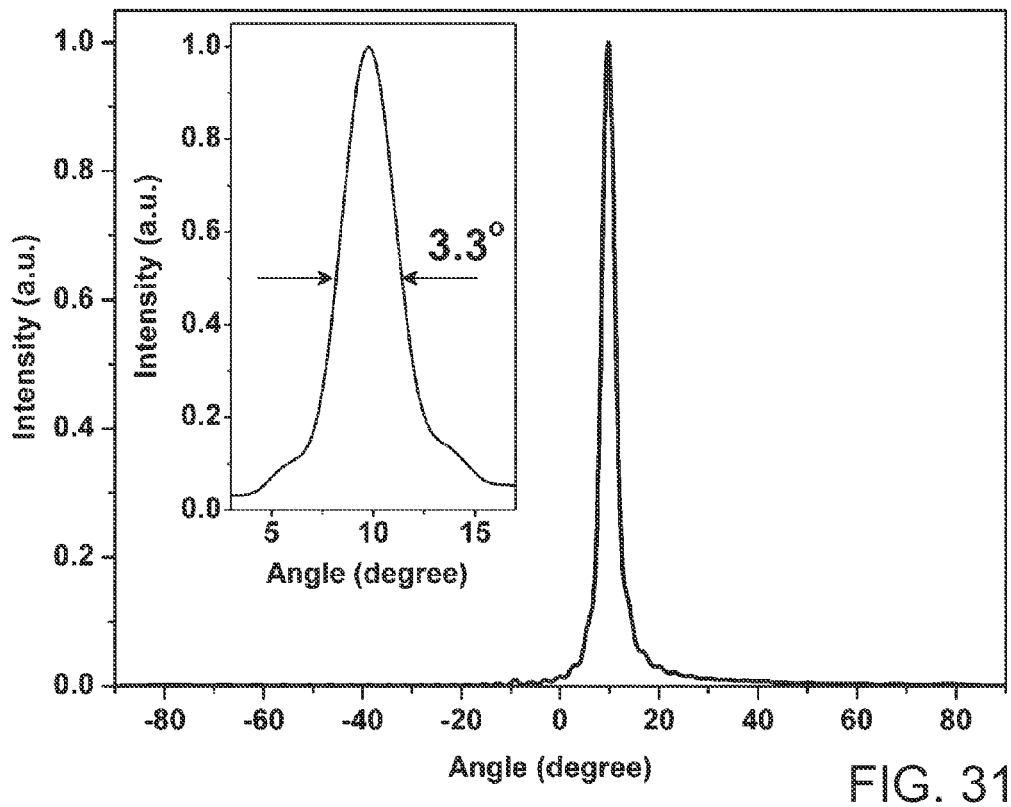

FIG. 31 illustrates the calculated far-field intensity distribution for the structure simulated in FIG. 30. Inset is the zoom-in view of the central peak.

Figure 32:
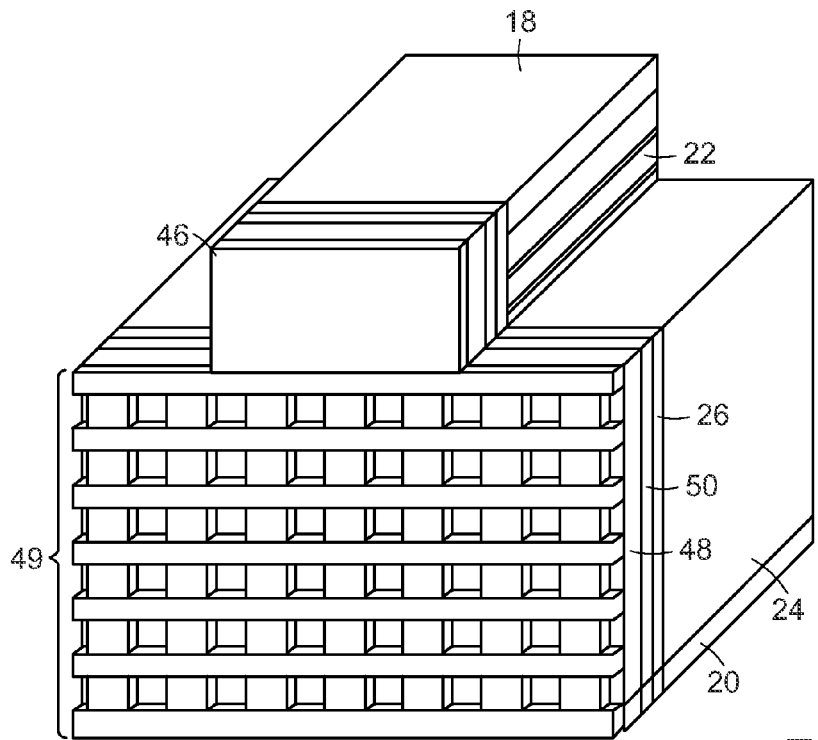

FIG. 32 illustrates a plasmonic collimator with a double-metal waveguide. The outer metal layer is patterned with a two-dimensional (2D) aperture array.

Figure 33:
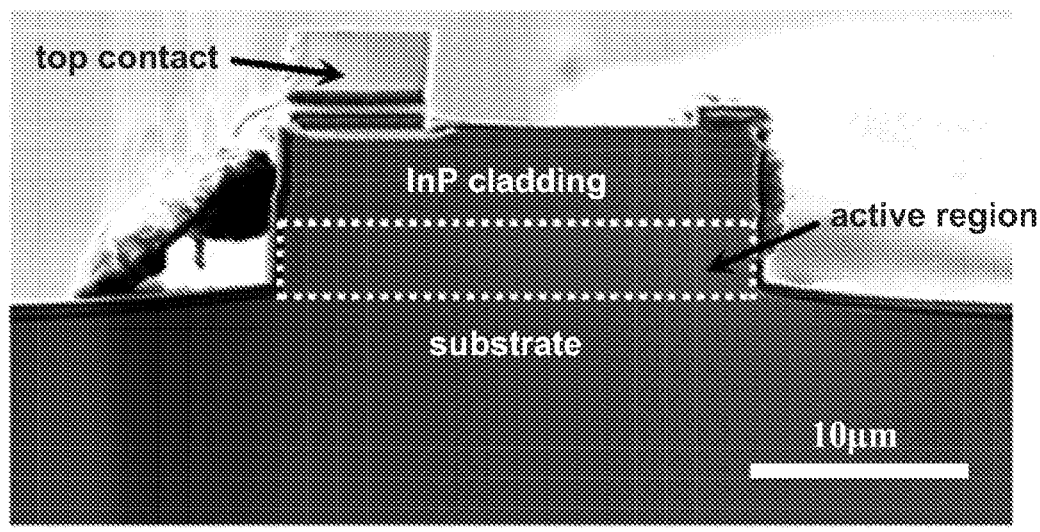

FIG. 33 shows a scanning electron microscope image of the facet of an original $\lambda_o$=9.9 µm ridge waveguide quantum cascade laser.

Figure 34:
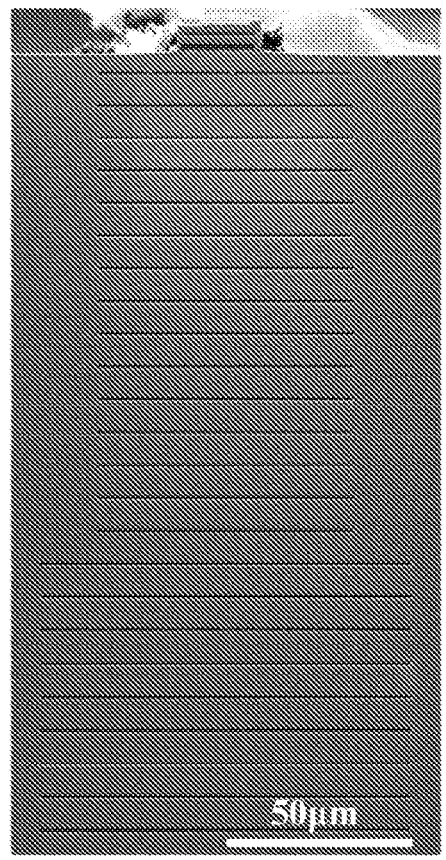

FIG. 34 shows a scanning electron microscope image of the facet of the laser shown in FIG. 33 after patterning a one-dimensional (1D) plasmonic collimator. There are 24 grating grooves.

Figure 35:
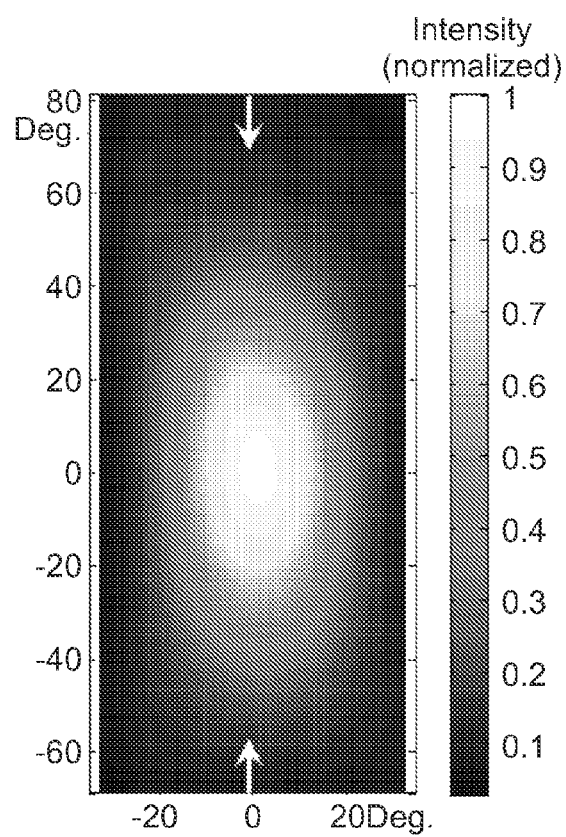

FIG. 35 shows the measured far-field emission profile of the device shown in FIG. 33.

Figure 36:
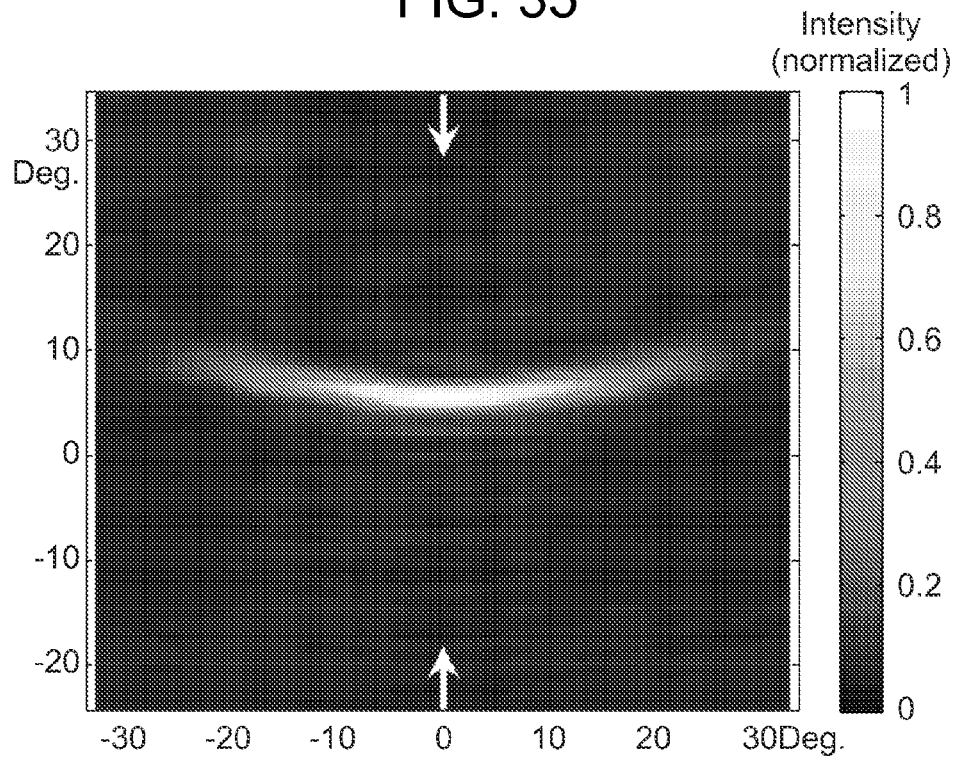

FIG. 36 shows the measured far-field emission profile of the device shown in FIG. 34.

Figure 37:
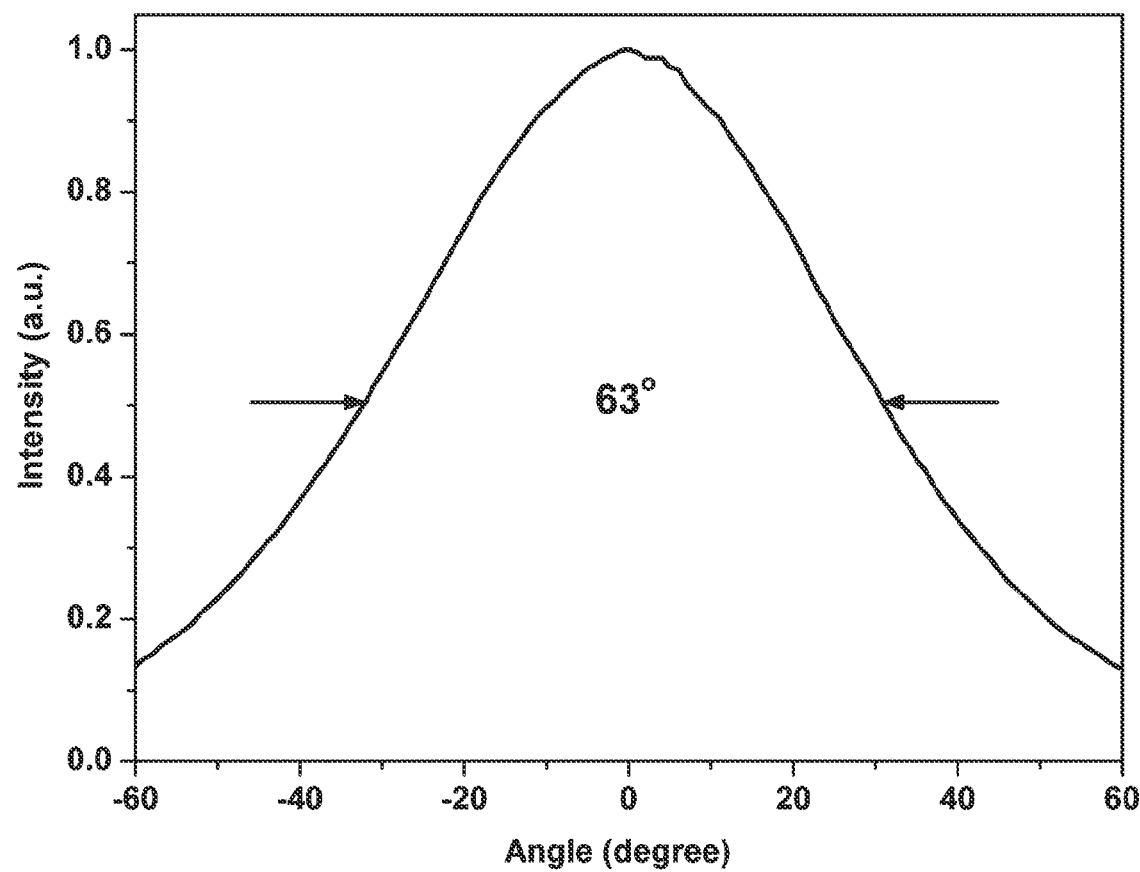

FIG. 37 shows vertical line scan along the arrows for FIG. 35.

Figure 38:
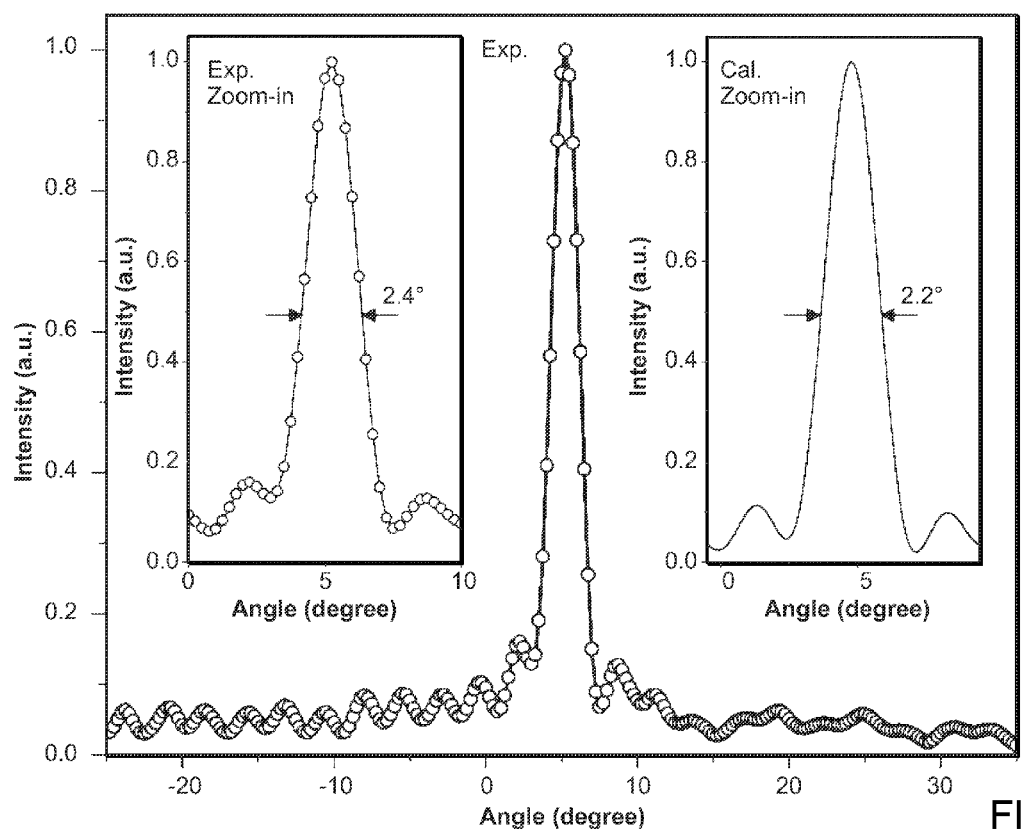

FIG. 38 shows a vertical line scan along the arrows for FIG. 36. The left inset is the zoom-in view of the central peak. The right inset is the calculated mode profile. The two insets match each other quite well.

Figure 39:
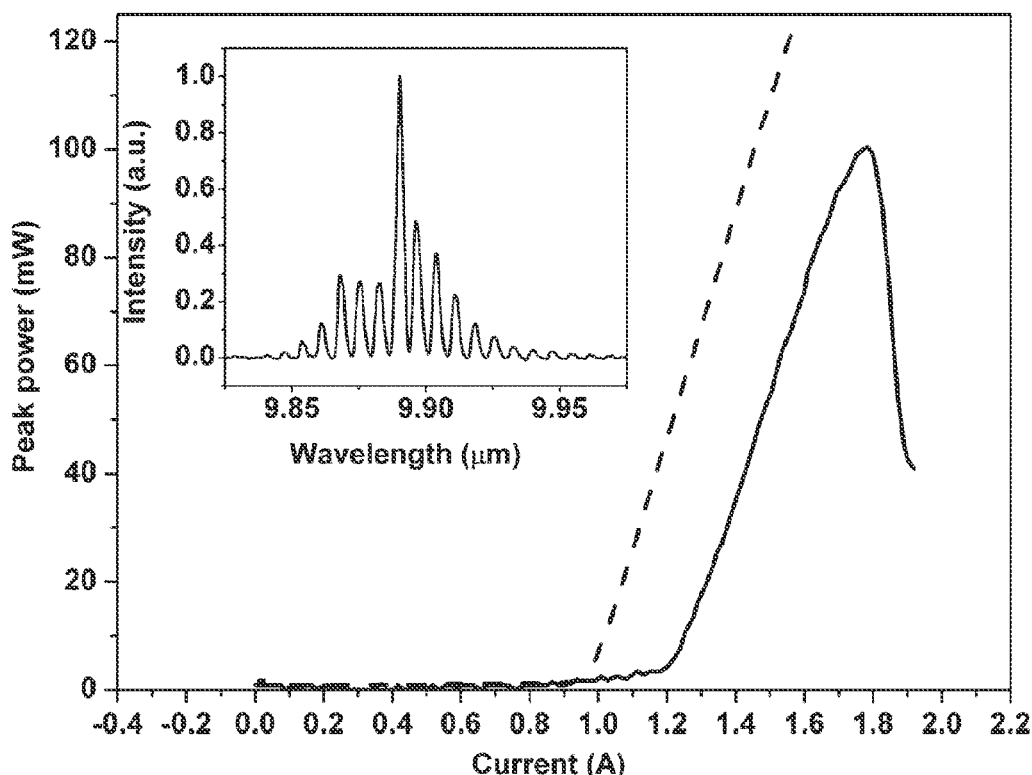

FIG. 39 illustrates the light output versus current (LI) characteristic taken for the device shown in FIGS. 33 and 34 (i.e., before and after defining the one-dimensional (1D) plasmonic collimator). The dashed and solid curves are for the original unpatterned device and the device patterned with the plasmonic collimator, respectively. Inset is the laser spectrum of the patterned device at a driving current of 1.5 A.

Figure 40:
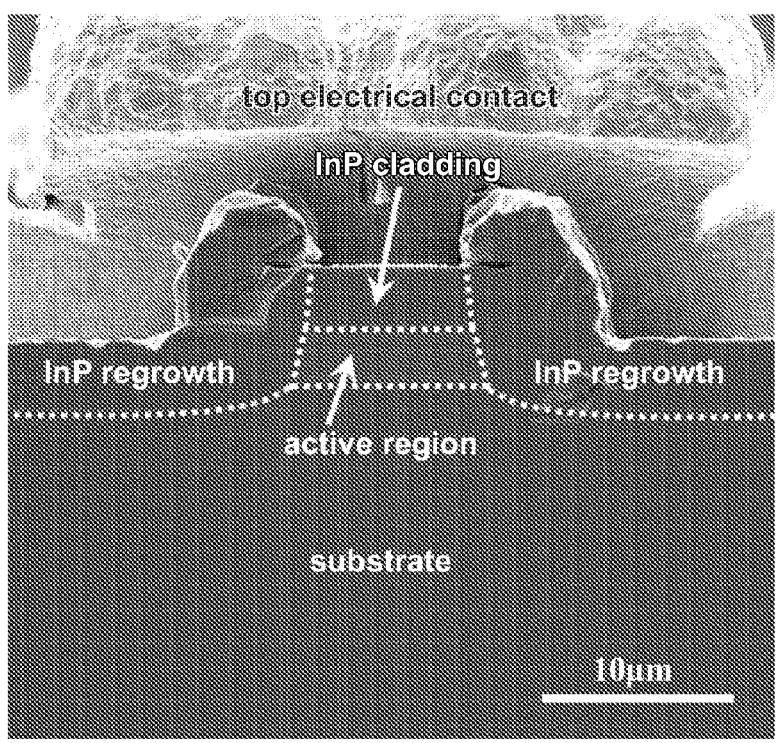

FIG. 40 shows a scanning electron microscope image of the facet of an original $\lambda_o$=8.06 µm buried-heterostructure quantum cascade laser.

Figure 41:
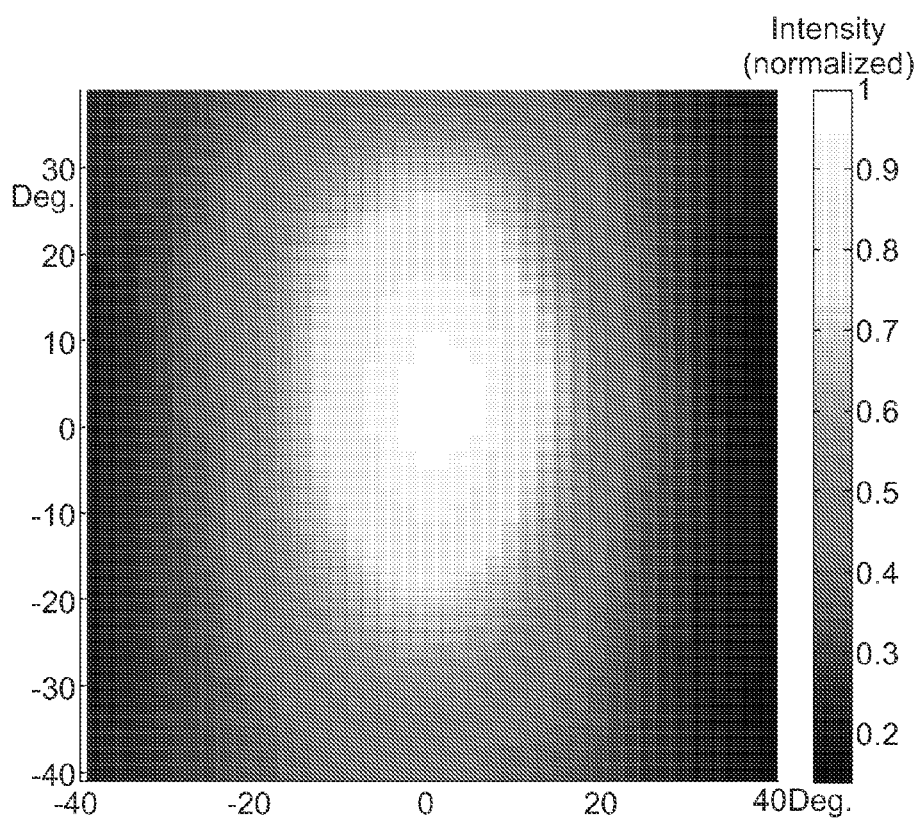

FIG. 41 shows the measured far-field emission profile of the device shown in FIG. 40.

Figure 42:
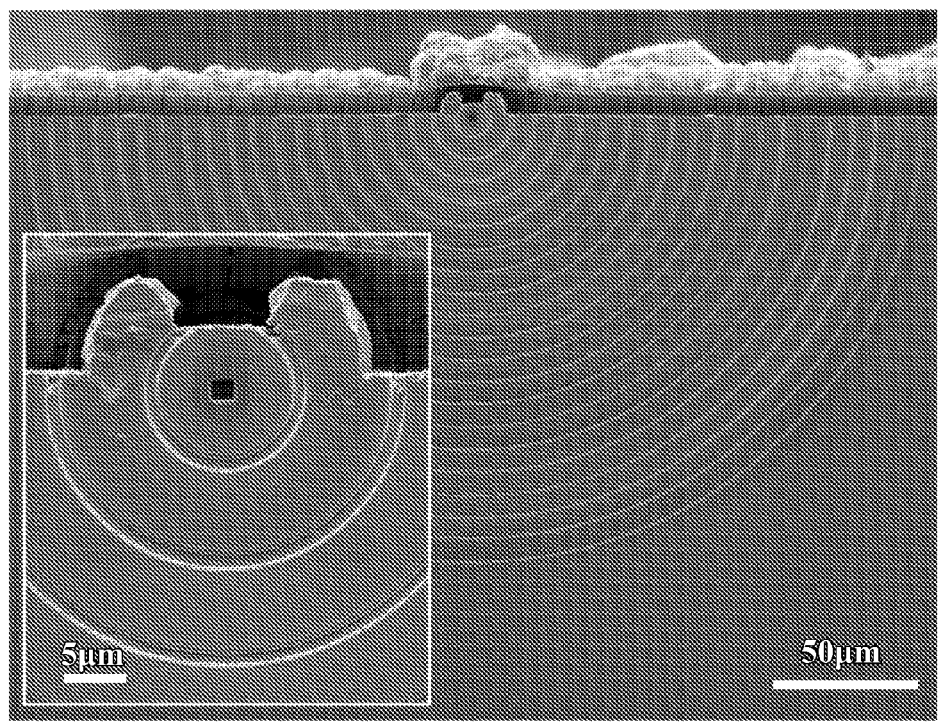

FIG. 42 shows a scanning electron microscope image of the facet of the laser shown in FIG. 40 after patterning a two-dimensional (2D) plasmonic collimator. There are 20 circular grating grooves. Inset is the zoom-in view.

Figure 43:
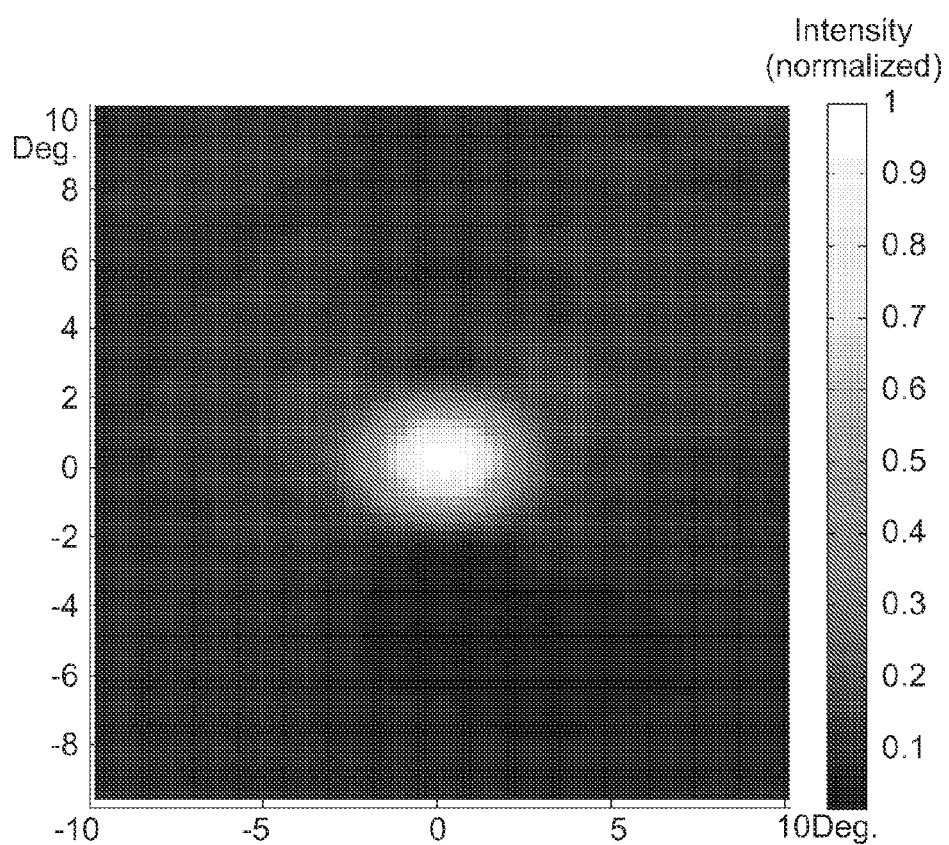

FIG. 43 shows the measured far-field emission profile of the device shown in FIG. 42.

Figure 44:
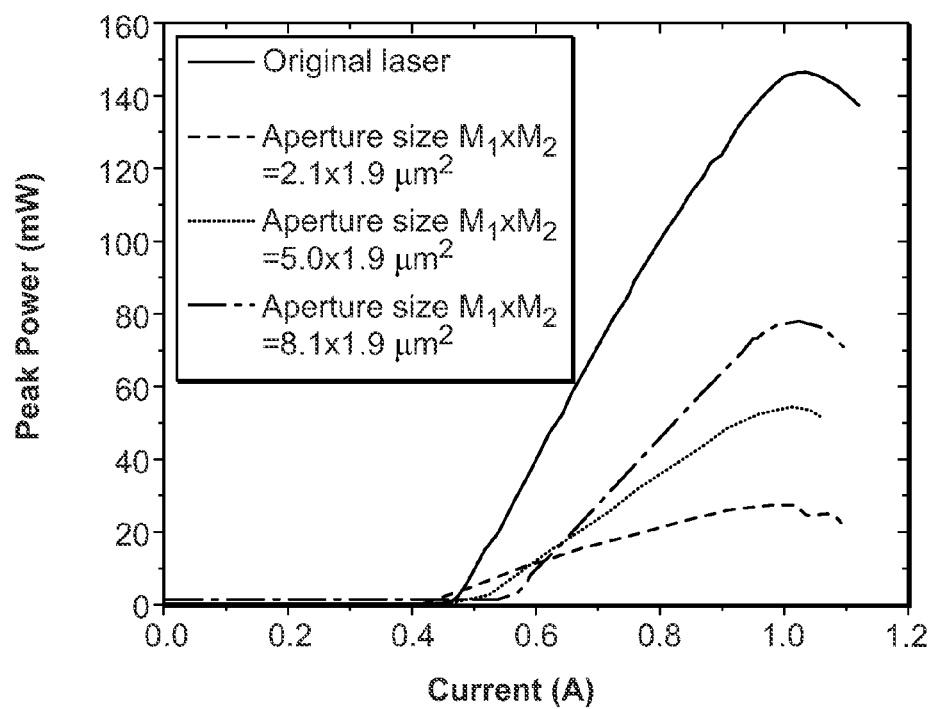

FIG. 44 illustrates light output versus current (LI) characteristics taken for the device patterned with 20 circular grating grooves. Solid line is for the original unpatterned device (FIG. 40); other curves are taken after the device has been patterned with collimators with various lateral aperture sizes.

Figure 45:
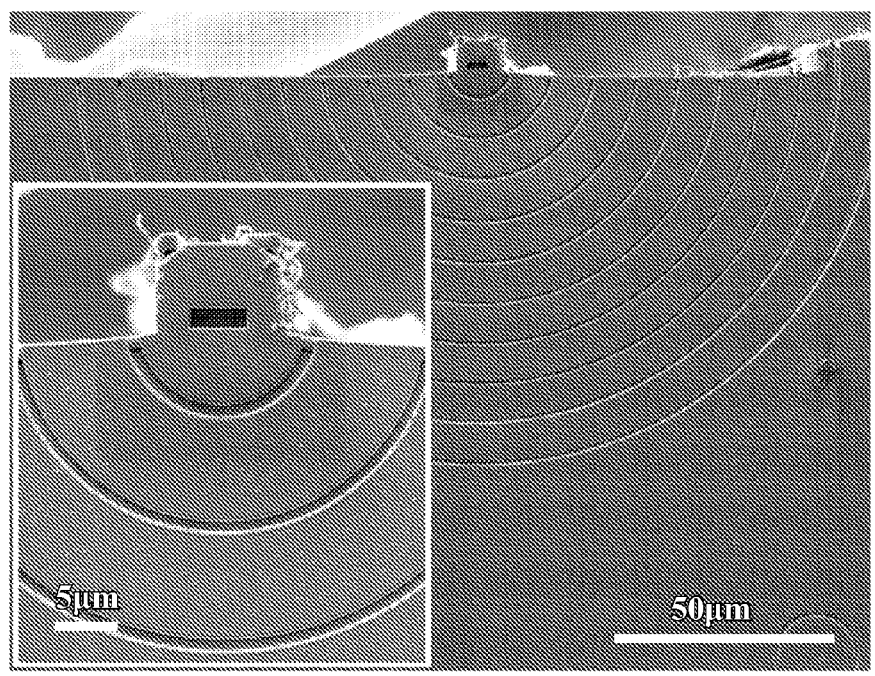

FIG. 45 shows a scanning electron microscope image of the facet of a $\lambda_o$=9.9 µm ridge waveguide quantum cascade laser patterned with a two-dimensional (2D) plasmonic collimator. There are 10 circular grating grooves. Inset is the zoom-in view.

Figure 46:
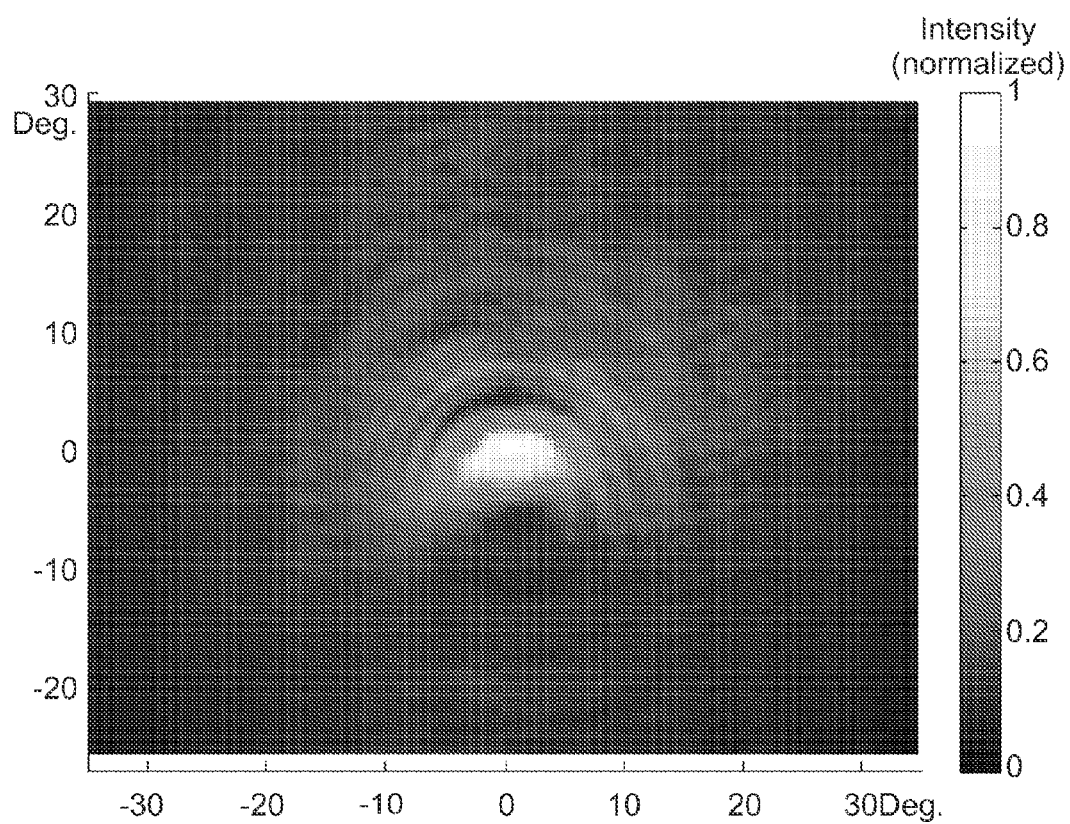

FIG. 46 shows the measured far-field emission profile of the device shown in FIG. 45.

DETAILED DESCRIPTION

The text that follows provides more-detailed descriptions of various concepts related to and inventive embodiments of methods and apparatus according to the present disclosure for improving collimation of device radiations. It should be appreciated that various aspects of the subject matter introduced above and discussed in greater detail below may be implemented in any of numerous ways, as the subject matter is not limited to any particular manner of implementation. Examples of specific implementations and applications are provided primarily for illustrative purposes.

Related work by the inventors is described in the following papers: N. Yu, et al., "Quantum cascade lasers with integrated plasmonic antenna-array collimators," Optics Express 16, 19447 (2008); N. Yu, et al., "Small divergence edge-emitting semiconductor lasers with two-dimensional plasmonic collimators," Applied Physics Letters 93, 181101 (2008); N. Yu, et al., "Small-divergence semiconductor lasers by plasmonic collimation," Nature Photonics 2, 564 (2008).

The working mechanism of the plasmonic collimator can be described as follows with reference to FIG. 1. The plasmonic collimator comprises an aperture 14 and grating grooves 16 patterned on the metal-coated device facet. The aperture 14 is located on the area where radiation comes out. The aperture 14 is at least subwavelength in one dimension. It couples a part of the device radiation into surface plasmons 28. The surface plasmons 28 propagate through the grating grooves 16 and are scattered by the grating grooves 16, producing many radiation reemissions 4. The location of the apertures 14 and the grating grooves 16 is chosen so that the direct emission 2 from the apertures 14 and all the reemissions 4 from the grating grooves 16 are in phase—i.e., their phase difference is equal to integral multiples of $2\pi$. The divergence of the device output is therefore reduced due to constructive interference between the direct emission 2 and the reemissions 4. The apertures 14 and the grooves 16 in the plasmonic collimator act effectively as an array of coherent light sources, which is analogous to phased array antennas used for directional broadcasting and space communications. Theoretically, the beam divergence angle should be inversely proportional to the number of the grating grooves N, and the peak intensity of the small divergence beam should be approximately proportional to $N^2$.

Figure 2:
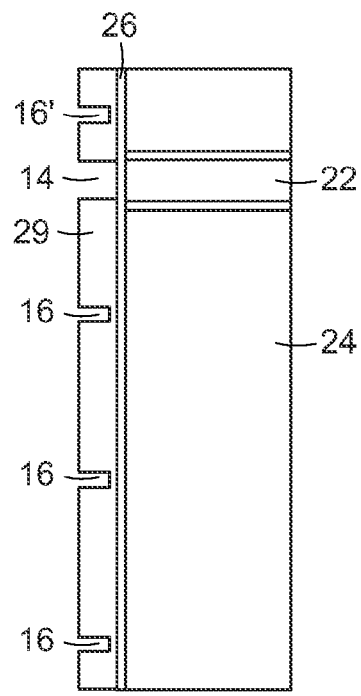
FIG. 2 illustrates the cross-section of a first configuration of the plasmonic collimator. In the configuration, the coating on the device facet comprises an insulating thin film and a thick metal film. The aperture and grooves are defined in the thick metal film.
Figure 3:
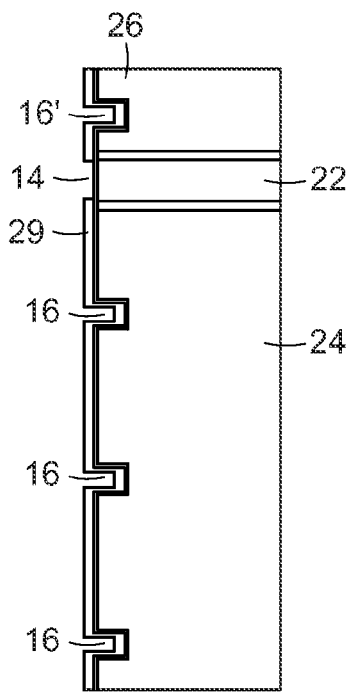
FIG. 3 illustrates the cross-section of a second configuration of the plasmonic collimator. The configuration consists of grooves that are sculpted directly into the bare device facet first, followed by deposition of the insulating and metal layers and then the opening of the aperture.

According to various embodiments of the present disclosure, integration of a plasmonic collimator onto the facet of a radiation-emitting device (e.g., a laser, light-emitting diode, optical fiber, etc.) comprises a series of steps. First, the device facet can be coated with a layer of electrically insulating dielectric 26 (e.g., alumina or silica) and a thick layer of metal 29 (e.g., gold, copper or silver). Second, focused ion beam (FIB) milling, photolithography, or electron beam lithography (EBL) can be used to define the aperture-groove structure in the thick metal layer. The aperture 14 is created in a location where the radiation exits the device. The aperture 14 is an opening though the metal film, whereas the depth of the grooves is smaller than the thickness of the metal film. The resulting configuration from these processes is shown in FIG. 2. An alternative way to fabricate the plasmonic collimator is as follows: first, grooves 16 can be cut on the bare device facet 24 using FIB milling, photolithography, or EBL; next, the insulating dielectric layer 26 and a thin layer of metal film can be deposited; and finally, FIB milling can be used to open the aperture 14. The resulting configuration from these processes is shown in FIG. 3. The two configurations shown in FIGS. 2 and 3 are equivalent in terms of beam collimation and power throughput. But for a certain type of radiation-emitting sources, one configuration may be easier to fabricate compared to the other.

Soft-lithographic techniques such as imprint lithography [S. Y. Chou, et al., "Imprint lithography with 25-nanometer resolution," Science, 272, 85 (1996)] and microcontact printing [P. C. Hidber, et al., "Microcontact printing of Palladium colloids: micron-scale patterning by electroless deposition of copper," Langmuir, 12, 1375 (1996)] can also be employed for patterning plasmonic collimators. These methods allow high throughput and cost-effective processing.

In the following paragraphs, the physical considerations used to design plasmonic collimators are discussed. Then, the issue of choosing the right type of plasmonic collimator for specific radiation sources is discussed. Plasmonic collimators can be divided into two types: the first type collimates radiation only in one dimension (1D) using 1D aperture-groove structures (FIGS. 4 and 5); the second type gives complete or two dimension (2D) collimation—i.e., collimation in the plane of the device emission facet, using 2D aperture-groove structures (FIG. 6).

Several geometric parameters of the plasmonic collimator can be optimized to yield the smallest beam divergence and the highest power throughput (e.g., more than half of that of an otherwise identical unpatterned laser) for a given facet area. Examples of relevant parameters include, but are not limited to, the thickness of the metal film, the shape and size of the aperture, the spacing between the grooves, the spacing between the aperture and the nearest groove, the total number of the grooves, and the width and the depth of each groove.

The thickness of the metal film can be at least a few (as used herein, a "few" can represent, e.g., at least 3) times the optical skin depth at the operational wavelength (e.g., about 120 nm for a wavelength of 9.9 µm). This will prevent surface plasmons from penetrating through the metal film, leading to unexpected consequences. "Skin depth" is used to characterize how deeply an electromagnetic field can penetrate into a metal layer and is defined as the distance where the magnitude of the electromagnetic field decays to 1/e (where e is the natural number e≈2.718) of the value on the surface of the metal layer.

Figure 8:
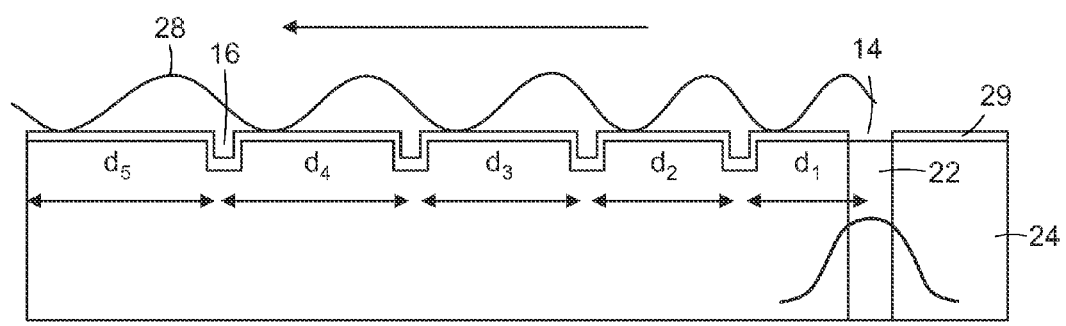
FIG. 8 illustrates the evolution of the spacing of grooves on the device facet and the evolution of the surface plasmon wavelength on the facet. Both increase slightly moving away from the aperture.

The spacings $d_i$ (i=1, 2, 3, ... n) (FIG. 8) can be adjusted to give the correct phase relations for the radiation 2 emerging from the aperture 14 and the reemissions 4 originating from the grating grooves 16, thus achieving maximum constructive interference between them. The surface plasmon wavelength $\lambda_{sp}$ is not a constant in the near zone around the aperture 14 [G. Lévêsque, et al., "Transient behavior of surface plasmon polaritons scattered at a subwavelength groove," Phys. Rev. B, 76, 155418 (2007); P. Lalanne, et al., "Interaction between optical nano-objects at metallo-dielectric interfaces," Nat. Phys. 2, 551 (2006)]. The surface plasmon wavelength in the immediate vicinity of the aperture, i.e. $\lambda_{sp\text{-}near}$, is usually a few percent smaller than the surface plasmon wavelength far away from the aperture, i.e. $\lambda_{sp\text{-}far}$. The transition region from $\lambda_{sp\text{-}near}$ to $\lambda_{sp\text{-}far}$ is on the order of ten times of the free space wavelength $\lambda_o$ for mid-infrared radiations and is smaller for visible radiations. Accordingly, an ideal design can have grooves 16 positioned at $d_i$ (i=1, 2, 3, ... n) to match the evolution of $\lambda_{sp}$ so that the direct emission 2 and the reemissions 4 differ in phase exactly by a factor of $2\pi m$ (m is an integer). As a first-order approximation of the ideal structure, a design with $d_1<d_2=d_3 ... =d_n=\Lambda$ can be chosen, where $d_1$ is the spacing between the aperture and the nearest groove and $\Lambda$ is the grating period. $d_1$ and $\Lambda$ can be determined in simulations by maximizing the peak intensity of the collimated beam. The optimized parameters were found to be $d_1$=7.3 µm and $\Lambda$=8.9 µm for $\lambda_o$=9.9 µm quantum cascade lasers and $d_1$=6.0 µm and $\Lambda$=7.8 µm for $\lambda_o$=8.06 µm quantum cascade lasers.

Figure 1:
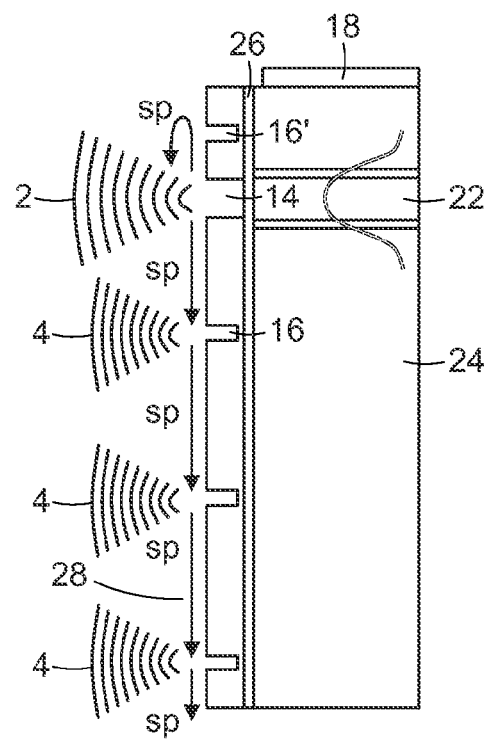
FIG. 1 illustrates the working mechanism of plasmonic collimation.
Figure 4:
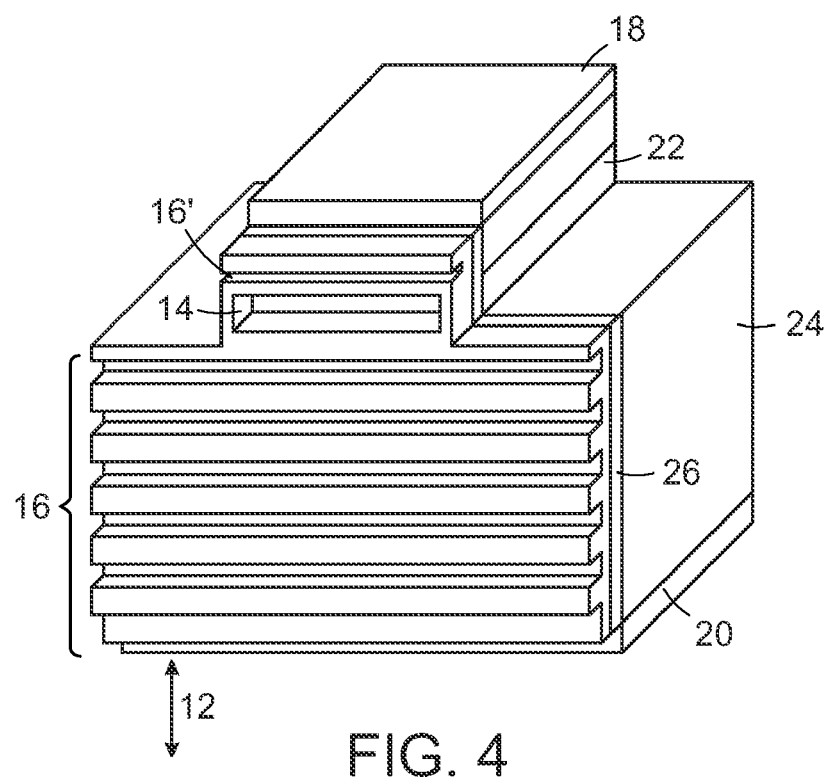
FIG. 4 illustrates an edge-emitting laser patterned with a one-dimensional (1D) plasmonic collimator. The electric-field polarization is assumed to be vertical.

Due to the limited area of the laser facet, the grating 16 may only be defined on the substrate side of the aperture (FIGS. 1, 2, 3, and 4). However, one or more additional grooves 16' can still be included on the other side of the aperture, between the aperture 14 and the top electrical contact 18 (FIGS. 1 and 4). These additional grooves 16' increase the intensity of the collimated beam and reduce the background radiation. Physically, these additional grooves 16' function as a reflector for the surface plasmons generated at the aperture 14 and propagating towards the laser top contact 18, thereby reducing scattering at the top contact 18 and maximizing the effectiveness of the grating grooves 16. The position of the reflector grooves 16' is chosen to maximize the constructive inference between the reflected surface plasmons and the surface plasmons generated at the aperture 14 and propagating towards the grating grooves 16. In one embodiment of the laser shown in FIG. 4, the midpoint of the top groove 16' is spaced 3.5 µm above the midpoint of the aperture 14 for a laser wavelength of 9.9 µm.

Narrow grooves are chosen so that each individual groove 16 introduces only small disturbance to the propagation of surface plasmons 28. It is found in simulations that wide grooves usually provide too strong scattering and therefore limit the propagation of surface plasmons 28 to the first few grooves. This would result in limited collimation because efficient functioning of the collimator depends on the number of the interfering reemissions 4.

The groove depth, h, is adjusted to allow the creation of groove cavity modes, i.e., standing waves along the depth of the grooves 16 [G. Lévêsque, et al., "Transient behavior of surface plasmon polaritons scattered at a sub-wavelength groove," Phys. Rev. B 76, 155418 (2007); L. Martin-Moreno, et al., "Theory of highly directional emission from a single sub-wavelength aperture surrounded by surface corrugations," Phys. Rev. Lett. 90, 167401 (2003)]. The resonance condition makes the otherwise inefficient scatters (i.e., narrow grooves 16) effective in coupling the surface plasmons 28 into free space.

It is favorable to have as many gratings grooves 16 as is practically feasible to reduce the divergence angle and to increase the collimated power. However, adding grooves will only have an impact if the surface plasmons 28 can reach them. The propagation distance of surface plasmons is thus the intrinsic limit. In the plasmonic collimator, the desired scattering into free space by the grating grooves 16 acts as the major factor limiting the propagation distance. Taking this factor into consideration, surface plasmons 28 can propagate over a few hundred micrometers at mid-infrared wavelengths (i.e., a distance equivalent to a few tens of free space wavelengths). This propagation distance allows one to pattern at least a few tens of grating grooves 16, enough to collimate device radiation within a few degrees.

Depending on the number of grating grooves, N, envisioned for a certain design, the groove width, w, can be fine tuned to make sure that the propagation range of surface plasmons 28 matches with the extent of the grating grooves 16. This fine tuning will make best use of the grating, giving the largest power throughput and the smallest collimation angle. In this respect, a design with a larger N should have grooves slightly narrower (i.e., less efficient in scattering surface plasmons) than a design with a smaller N.

The above discussions on several design parameters (i.e., metal thickness; position of the grating grooves; position of the reflector grooves; the depth, h, and width, w, of the grating grooves; and the number of the grating grooves, N) apply for both the 1D and the 2D plasmonic collimators. The differences between the two lie in their apertures and shape of the grating grooves. In 1D collimation, the grating is one dimensional with straight parallel grating grooves (FIG. 4); in the 2D collimation, the grating is a set of concentric circular grooves (FIG. 6).

The aperture 14 for the 1D collimation is a slit (FIG. 4). The slit is subwavelength in the direction normal to the grating grooves 16 in order to efficiently couple device radiation into surface plasmons 28. The optimal slit width can be determined by simulations. A narrower slit strongly back-scatters the radiation coming from inside the device and therefore reduces power throughput; a wider slit is less efficient in coupling device radiation into surface plasmons, leading to a large background in the far field. In one embodiment of the laser shown in FIG. 4, the optimized slit width is found to be about 2 µm for a laser wavelength of 9.9 µm, which is close to the active region thickness. In the other dimension parallel to the grating grooves 16, the slit aperture 14 can be as wide as possible to allow maximum power output. 1D collimation only gives collimation in the direction normal to the grating grooves 16.

Figure 6:
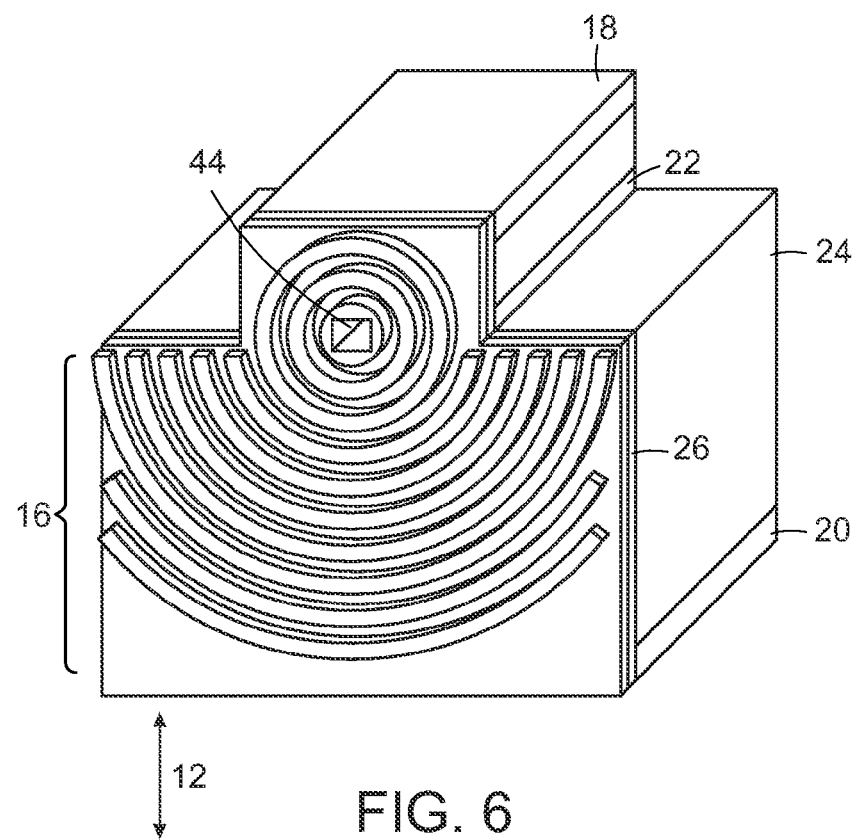
FIG. 6 illustrates an edge-emitting laser patterned with a two-dimensional (2D) plasmonic collimator.
Figure 7:
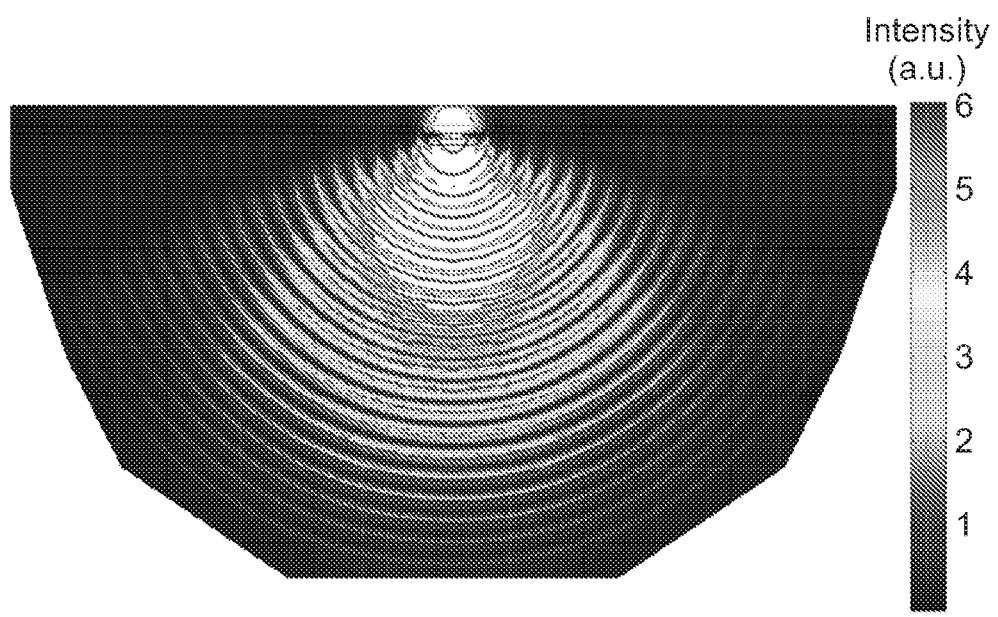
FIG. 7 illustrates the intensity distribution of surface plasmons on the device facet for the device shown in FIG. 5. The electric-field polarization is assumed to be vertical.

The aperture 14 for the 2D collimation is subwavelength in both vertical and lateral directions (FIG. 6). These subwavelength dimensions enable an efficient coupling of device radiation into surface plasmons 28 propagating on the device facet in two dimensions. These surface plasmons 28 are scattered by the 2D grating grooves 16, which leads to complete or 2D collimation in the far field. Again, there is a trade-off between device power throughput and beam collimation. If the aperture 14 is deep-subwavelength with dimensions much smaller than the free space wavelength $\lambda_o$, the coupling of device radiation into surface plasmons 28 is efficient, but power transmission is severely limited by the small aperture size; on the other hand, if the aperture 14 is too large, say, comparable to $\lambda_o$, the radiation endures limited diffraction at the aperture 14 and almost emits into the far field directly, which gives poor beam collimation. In one embodiment of the quantum cascade laser shown in FIG. 6, because quantum cascade lasers are transverse-magnetic (TM) polarized with vertical electric field, surface plasmons 28 propagate preferentially in the vertical direction. To achieve a broad spreading of surface plasmons 28 also in the lateral direction, the lateral size of the aperture should be subwavelength. A good trade-off between power throughput and beam collimation is an aperture with vertical size about 2 µm and lateral size about 4~6 µm for a laser wavelength of 8.06 µm. FIG. 7 shows a simulation of the distribution of surface plasmons on the device facet for a $\lambda_o$=8 µm quantum cascade laser patterned with a 2D collimator consisting of a 2×4 µm² aperture and 20 grating grooves.

Figure 9:
FIG. 9 illustrates a rectangular aperture through which the device radiation exits on the facet surface.
Figure 10:
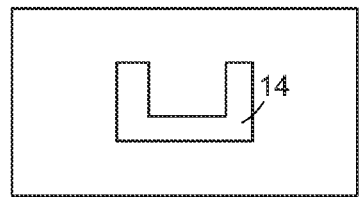
FIG. 10 illustrates a C-shaped aperture through which the device radiation exits on the facet surface.
Figure 11:
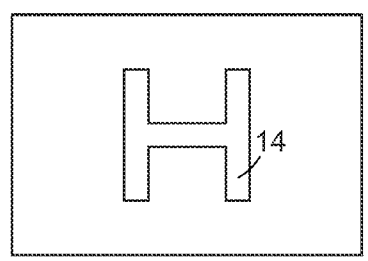
FIG. 11 illustrates an H-shaped aperture through which the device radiation exits on the facet surface.
Figure 12:
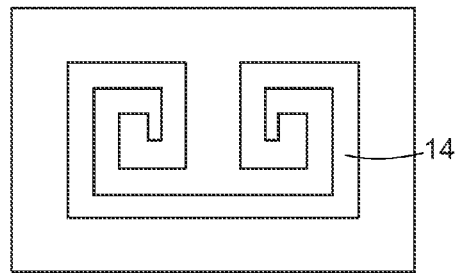
FIG. 12 illustrates a spiral aperture through which the device radiation exits on the facet surface.
Figure 13:
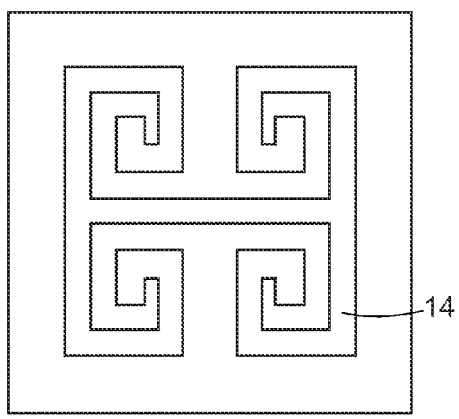
FIG. 13 illustrates another embodiment of a spiral-shaped aperture through which the device radiation exits on the facet surface.

The aperture 14 on the laser facet can have any of a variety of configurations. In a simple configuration, shown in FIGS. 6 and 9, the aperture 14 has a rectangular shape. In other arrangements, the C-shape in FIG. 10, the H-shape in FIG. 11, and the spiral shapes in FIGS. 12 and 13 can be used. Slot antenna theory predicts that these more complex apertures can allow much more power throughput compared to a rectangular aperture of the same area [R. Azadegan, et al., "A novel approach for miniaturization of slot antennas," IEEE Trans. Antennas Propag. 51, 421 (2003)]. Other meandering shapes (e.g., an S-shape) can likewise be used.

Based on the characteristics of the sources and the desired properties of the final collimated beam, different radiation-emitting sources can use different plasmonic collimator designs.

Figure 5:
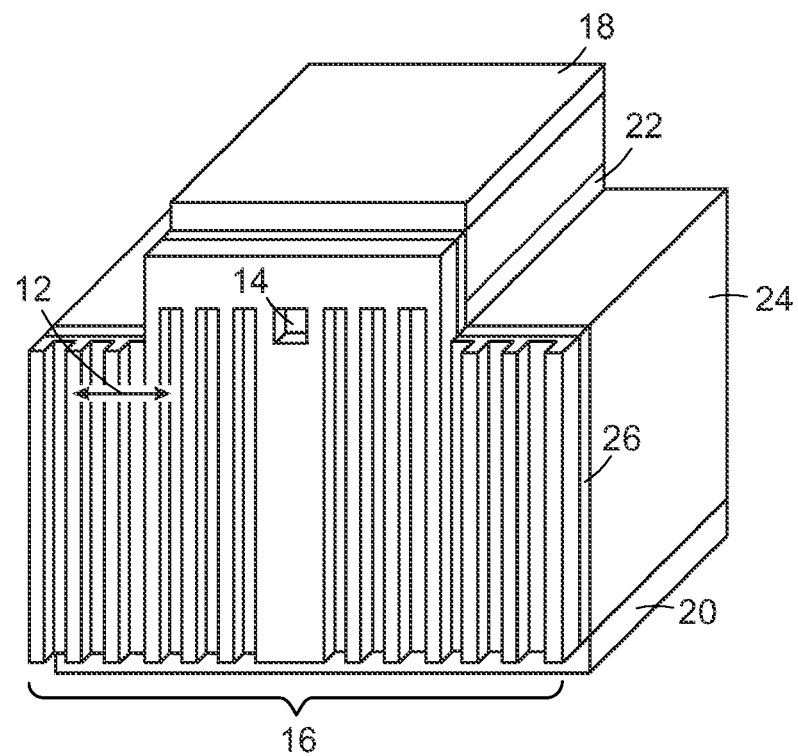
FIG. 5 illustrates an edge-emitting laser patterned with a one-dimensional (1D) plasmonic collimator. The electric-field polarization is assumed to be horizontal.

For example, for an edge-emitting semiconductor laser (e.g., a laser diode or quantum cascade laser) which has a known electric-field polarization 12, if only 1D collimation is required, a plasmonic collimator with the aperture 14 and each groove 16 oriented perpendicular to the field polarization 12 (as shown in FIGS. 4 and 5) can be a suitable choice. For a quantum cascade laser, the field polarization is in the vertical direction (FIG. 4); for a laser diode the field is in the horizontal direction (FIG. 5). Consequently, the orientation of the aperture-groove structure for the two devices is different. As shown in FIGS. 4 and 5, the lasers further include a top electrical contact 18 (formed of a conductive metal, such as gold), an active region 22 (formed of semiconductor quantum wells and having a width—measured vertically, as shown—approximately the same as the vertical width of the aperture 14), a substrate 24 (formed of, e.g., indium phosphide), an insulating dielectric 26 (formed of, e.g., alumina) and a back electrical contact 20 (formed of a conductive metal, such as gold).

In one embodiment of the laser shown in FIG. 4, based on simulations, we use the following optimized parameters, presented in Table 1, for two types of quantum cascade lasers with different wavelengths. Similar design procedure will lead to optimized designs for edge-emitting semiconductor lasers at other wavelengths.

TABLE 1

| | grating period, $\Lambda$ (µm) | groove width, w (µm) | groove depth, h (µm) | Distance between the aperture and the first grating groove $d_1$(µm) |
|---|---|---|---|---|
| $\lambda_o$ = 8.06 µm buried heterostructure QCLs | 7.8 | 0.6 | 1.0 | 6.0 |
| $\lambda_o$ = 9.95 µm ridge QCLs | 9.4 | 0.8 | 1.5 | 7.2 |

If 2D collimation is envisioned for an edge-emitting semiconductor laser, a plasmonic collimator with a rectangular aperture 14 and a circular grating 16 can be used (FIG. 6). The same optimized parameters presented in Table 1 can be used for the corresponding laser wavelength.

Figure 14:
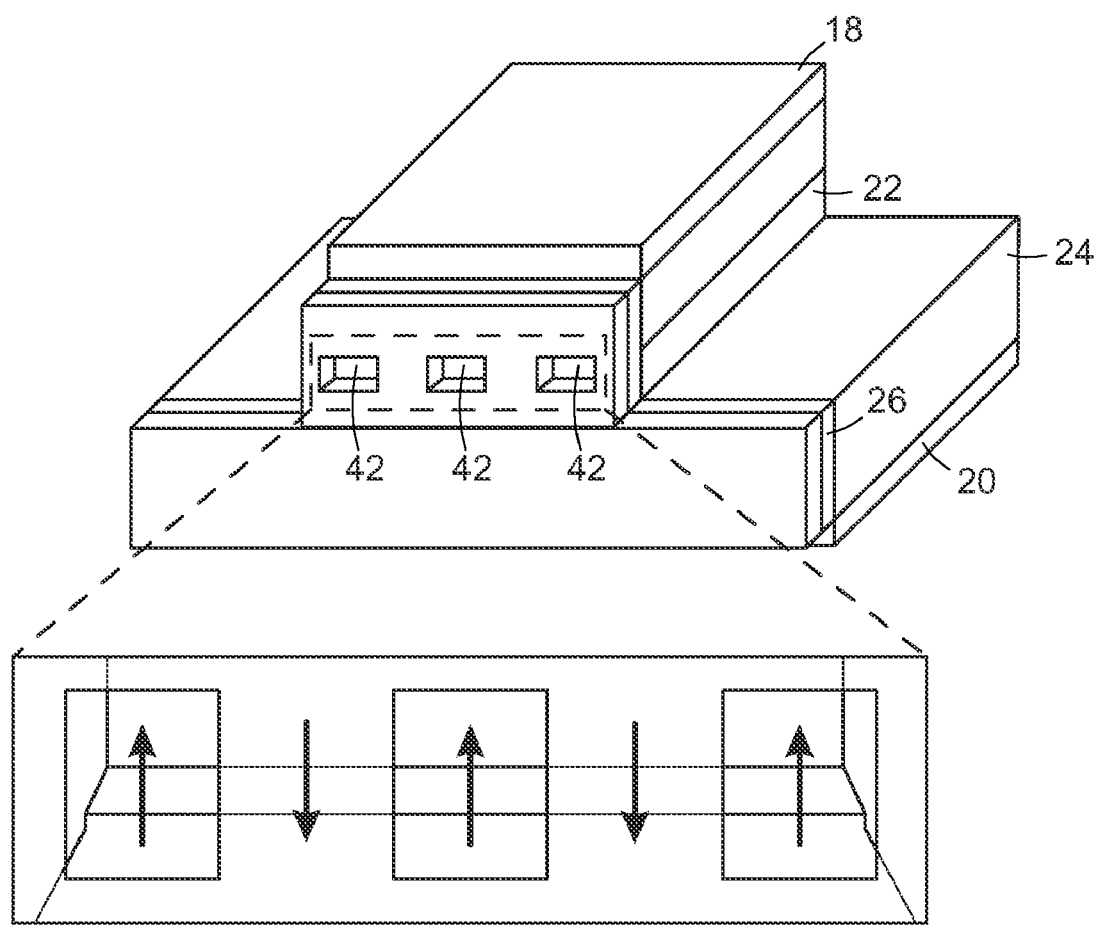
FIG. 14 illustrate an edge-emitting laser with an aperture-array structure defined on its facet.

Collimation of beams in the lateral direction (i.e., perpendicular to the material-growth direction) for edge-emitting semiconductor lasers can also be achieved by using an aperture-array structure 42 defined on the device facet, as shown in FIG. 14. The aperture array 42 is located on the part of a laser transverse mode where the electric field has the same polarization. By way of example, the enlarged view in FIG. 14 shows the polarization of different lobes for the $TM_{04}$ mode of a quantum cascade laser and how the aperture array 42 blocks the two lobes with downward polarization. By eliminating the contributions from the counter-polarized components of the mode, a single beam of light in the far field with a low divergence angle in the lateral direction can be generated.

Figure 15:
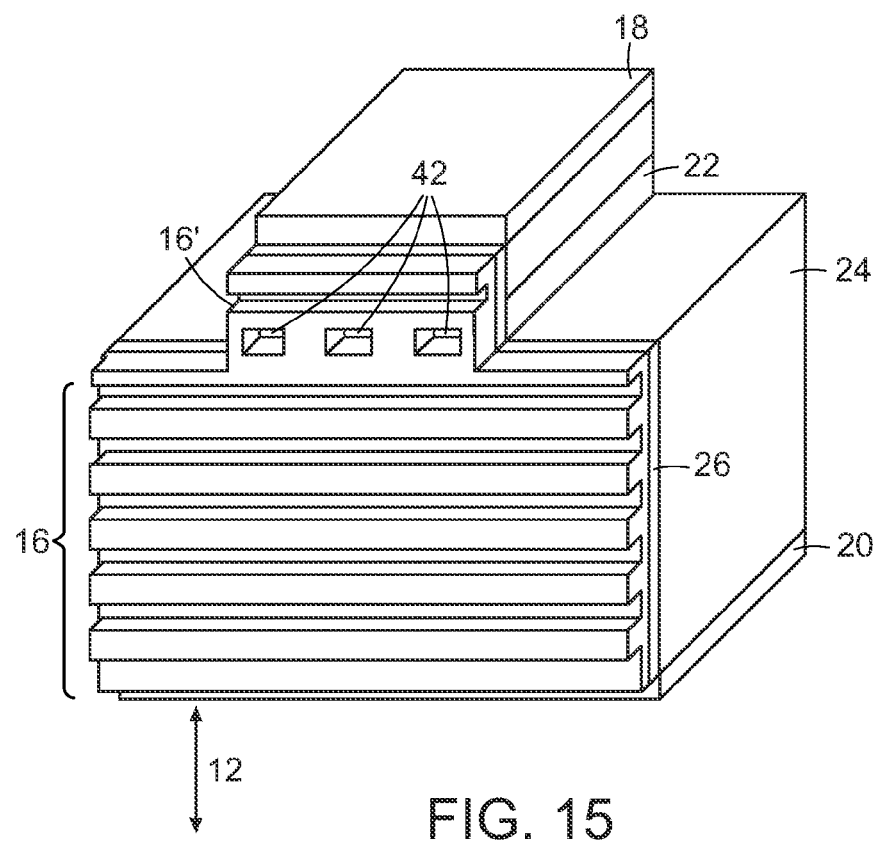
FIG. 15 illustrate an edge-emitting laser with an aperture-array and a one-dimensional (1D) grating defined on its facet.

Combinations of the aforementioned design structures can be employed to collimate light in other ways. For example, 2D collimation can be achieved for an edge-emitting semiconductor laser by combining elements of the structures depicted in FIG. 4 and FIG. 14, as shown in FIG. 15.

Figure 16:
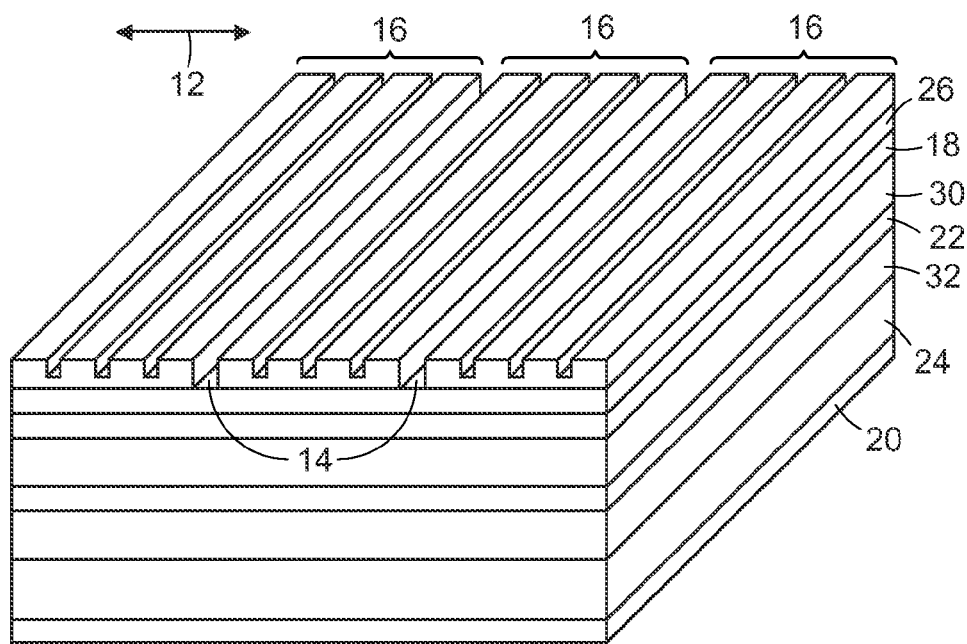
FIG. 16 illustrates a vertical-cavity surface-emitting laser (VCSEL) patterned with an aperture-groove structure comprising multiple apertures and gratings.

For vertical-cavity surface-emitting lasers (VCSELs), particularly those with unstable polarization, a multi-aperture-groove structure, as shown in FIG. 16, may be a suitable choice. This multi-aperture-groove structure provides several advantages when integrated with VCSELs. For example, the structure only allows the field component with polarization perpendicular to the apertures/grooves to pass through, yielding a laser output of well-defined polarization. Additionally, since VCSELs have a much-larger emission area compared with edge-emitting lasers, the plasmonic structure with multiple apertures can allow a larger power throughout. The VCSEL of FIG. 16 includes an upper Bragg reflector 30 and a lower Bragg reflector 32 on either side of the active region 22.

Figure 17:
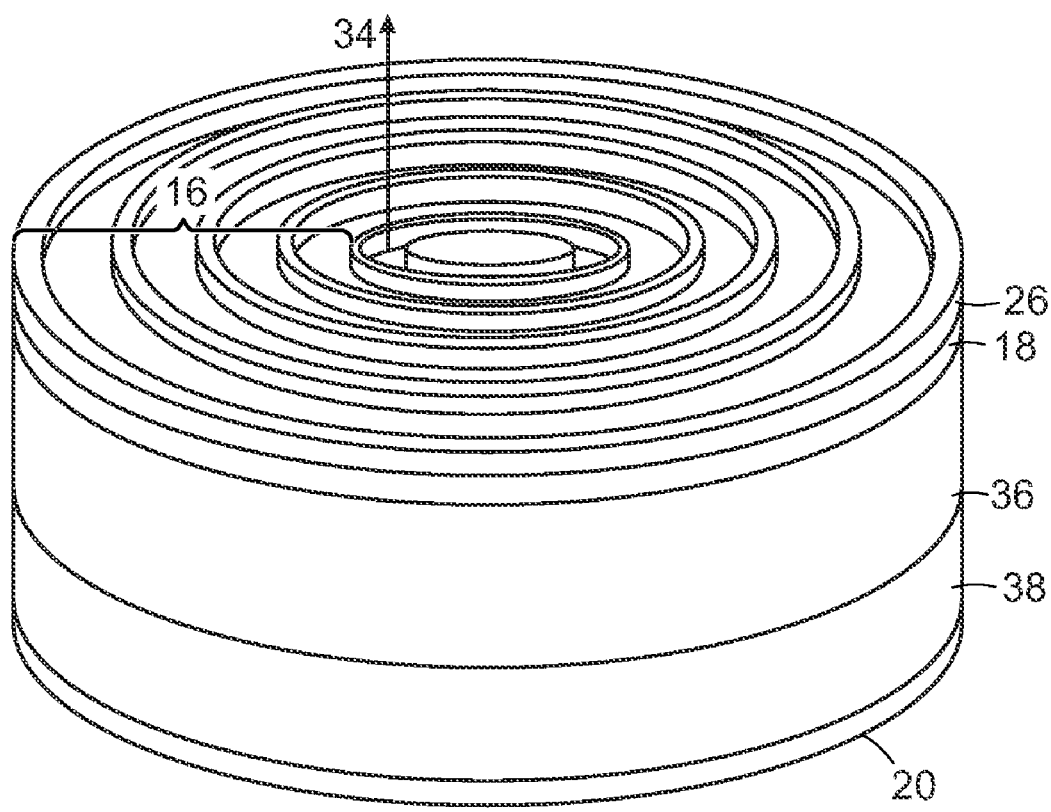
FIG. 17 illustrates a light-emitting diode (LED) patterned with a ring-aperture-groove structure comprising a ring aperture surrounded by a circular grating.

For a light-emitting diode (LED) in which the light output does not have a specific polarization, a ring-aperture-groove structure comprising a central ring-aperture 34 and a set of concentric grooves 16, as shown in FIG. 17, can be employed. The advantages of this structure include its applicability for use with a light source of any polarization and its higher throughput compared with an aperture-groove structure comprising a hole-aperture and a set of concentric grooves. The LED of FIG. 17 further includes a p-doped region 36 and an n-doped region 38 between the top and back contacts 18 and 20.

Figure 19:
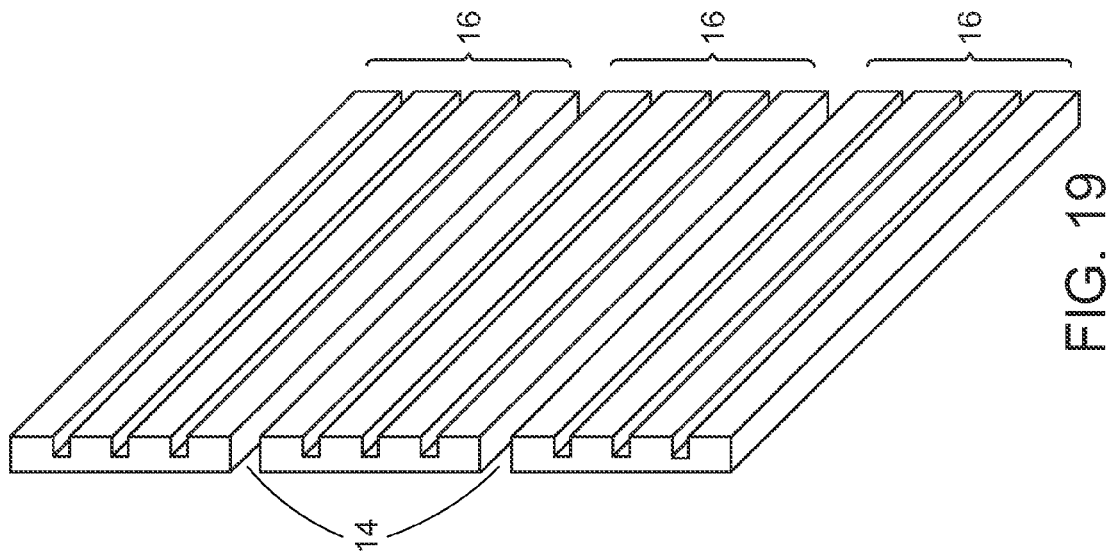
FIG. 19 illustrates an aperture-groove structure comprising multiple apertures and gratings for an optical fiber.
Figure 18:
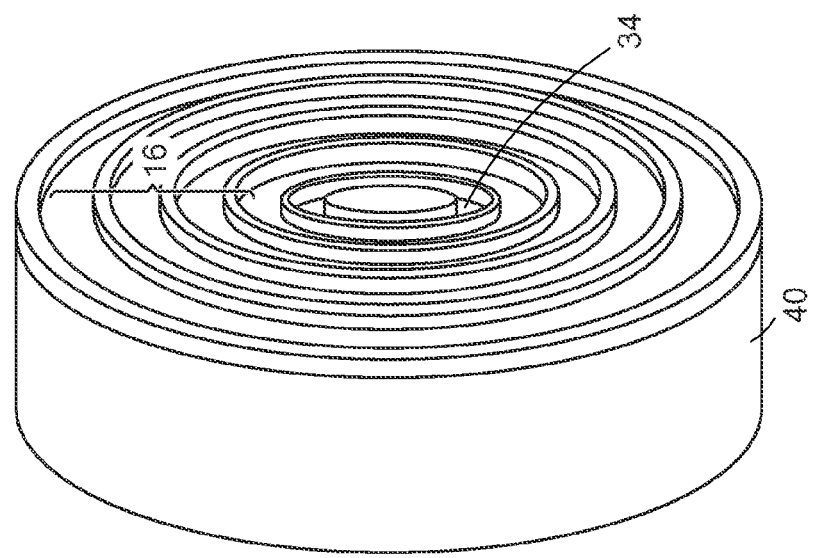
FIG. 18 illustrates a ring-aperture-groove structure on an optical fiber.

For an optical fiber 40, either the ring-aperture-groove structure (FIG. 18) or the multi-aperture-groove structure (FIG. 19) can be used depending on the desired polarization of the light output. The optical fiber can be an active fiber device (e.g., a fiber laser, erbium-doped fiber amplifier) or a passive fiber that is used to couple light into some other optical components.

Figure 20:
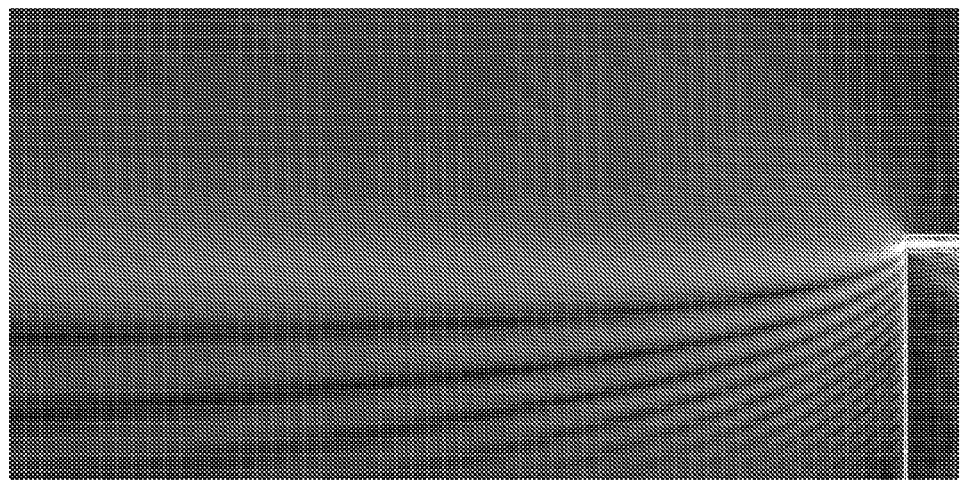
FIG. 20 illustrates the simulation result of the intensity distribution around a plasmonic collimator of the first configuration (FIG. 2) defined on a $\lambda_o$=9.9 μm quantum cascade laser. It is assumed that there are 15 grating grooves.
Figure 21:
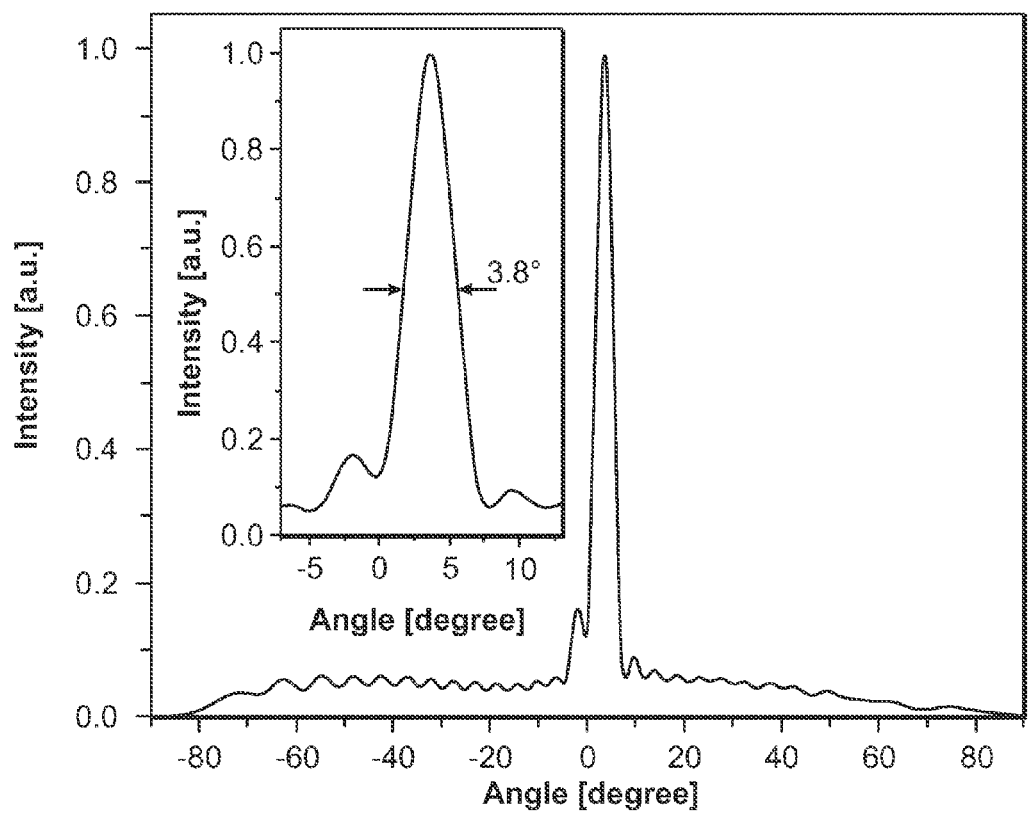
FIG. 21 illustrates the calculated vertical far-field intensity distribution for the device simulated in FIG. 20. Inset is the zoom-in view of the central peak.

Results from simulations of beam collimation for quantum cascade lasers based on the aperture-groove structure help illustrate the feasibility of the design and the dramatic effects of the plasmonic collimators (FIGS. 20-23). FIG. 20 illustrates the results of a simulation of the intensity distribution around a $\lambda_o$=9.9 μm quantum cascade laser with an optimized 1D plasmonic collimator defined on its facet according to the configuration shown in FIG. 2. FIG. 21 illustrates the calculated far-field intensity distribution for the device.

Figure 22:
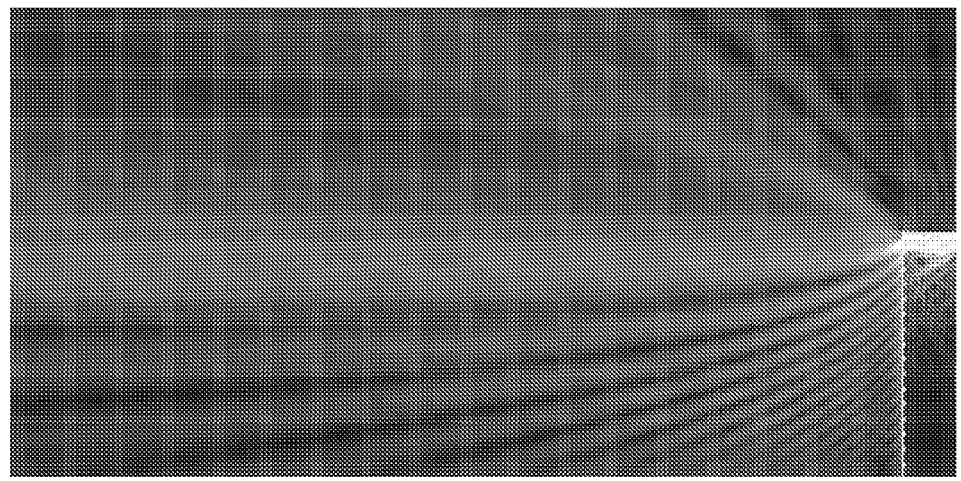
FIG. 22 illustrates the simulation result of the intensity distribution around a plasmonic collimator of the second configuration (FIG. 3) defined on a $\lambda_o$=9.9 μm quantum cascade laser. It is assumed that there are 15 grating grooves.
Figure 23:
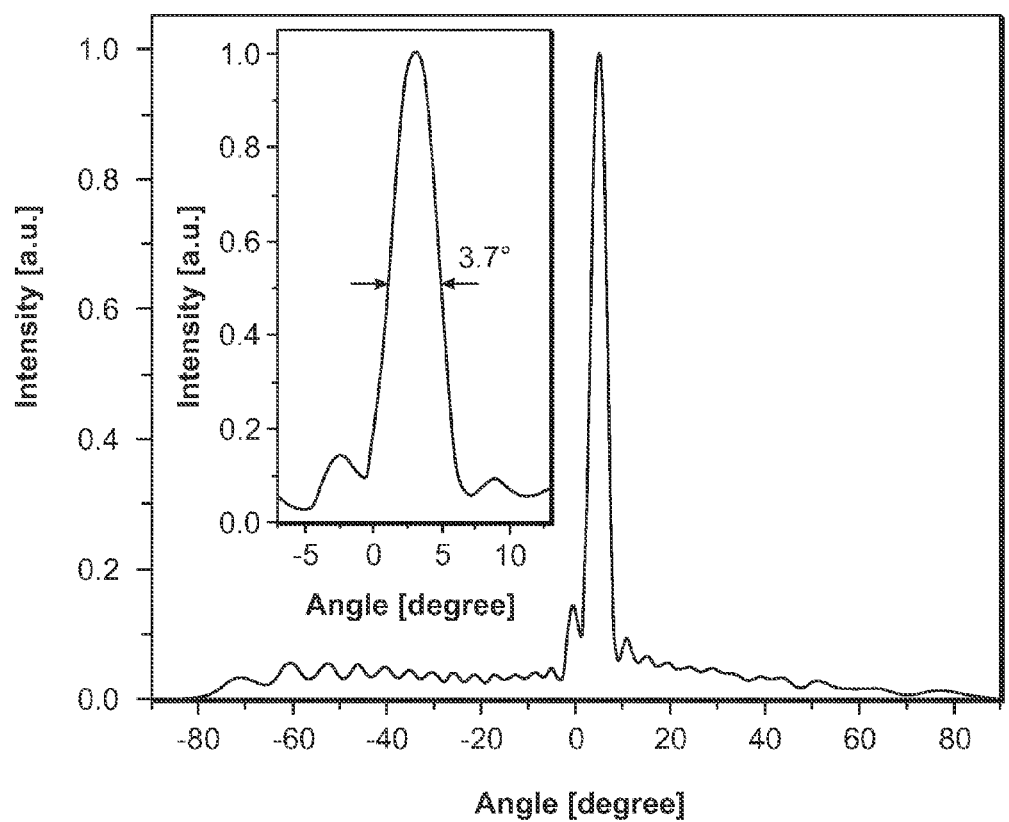
FIG. 23 illustrates the calculated vertical far-field intensity distribution for the structure simulated in FIG. 22. Inset is the zoom-in view of the central peak.
Figure 24:
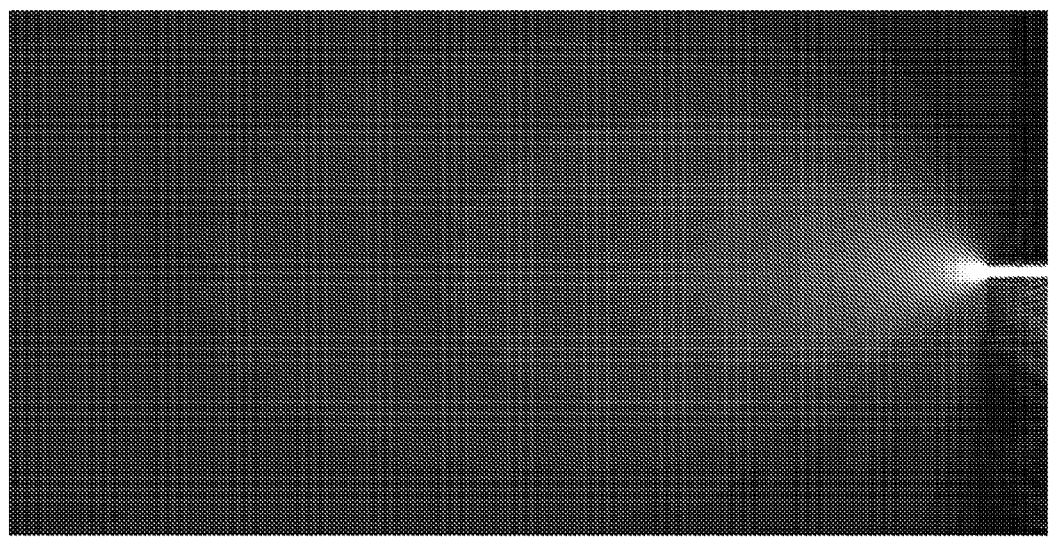
FIG. 24 illustrates the simulation result of the intensity distribution for a control structure—i.e., an original $\lambda_o$=9.9 μm quantum cascade laser without a plasmonic collimator.
Figure 25:
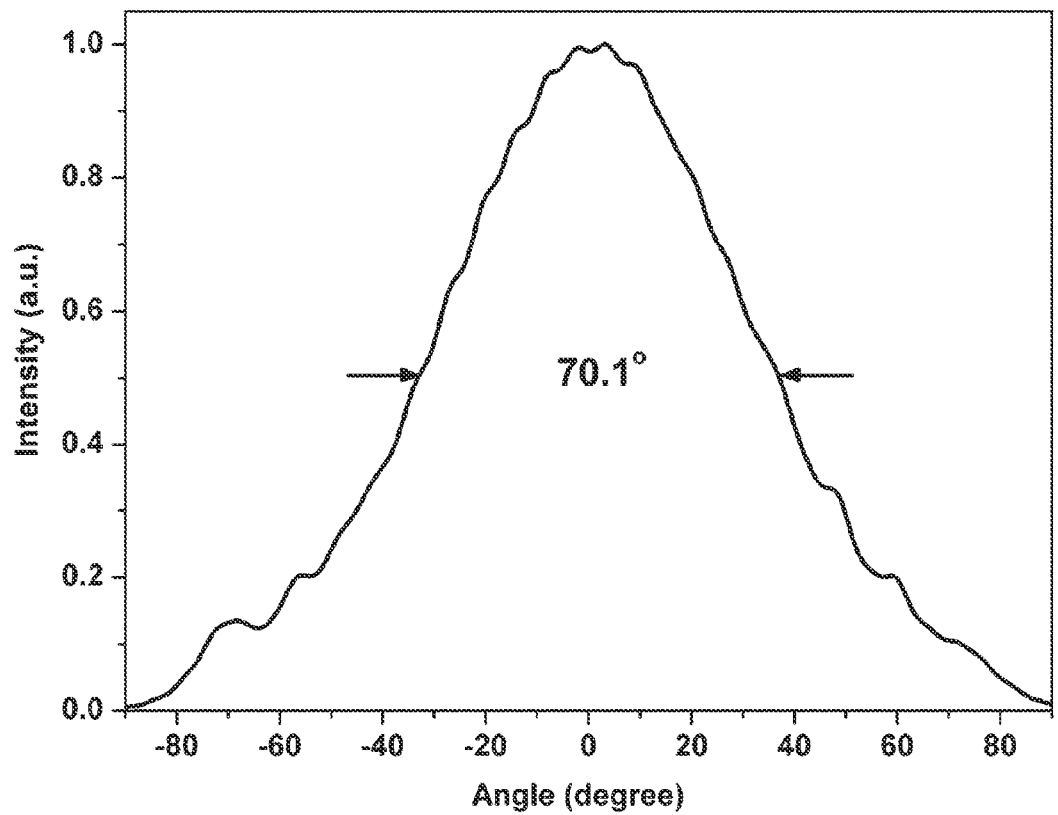
FIG. 25 illustrates the calculated vertical far-field intensity distribution for the structure simulated in FIG. 24.

FIGS. 22 and 23 present, respectively, a two-dimensional simulation of the intensity distribution and the calculated far-field intensity distribution for a $\lambda_o$=9.9 μm quantum cascade laser with an optimized 1D plasmonic collimator defined on its facet according to the configuration shown in FIG. 3. In these simulations and calculations (FIGS. 20-23), there are 15 grating grooves patterned on the laser facet. It is notable that there is more than a one-order-of-magnitude reduction in beam divergence normal to the material layers for the two designs presented above compared to a laser without a plasmonic collimator (FIGS. 24 and 25). For the control simulation, FIGS. 24 and 25 present respectively, a 2D simulation of the intensity distribution and the calculated far-field intensity distribution for an unmodified $\lambda_o$=9.9 μm quantum cascade laser.

Figure 26:
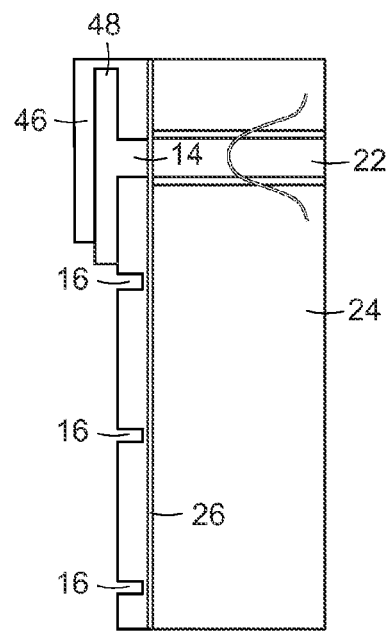
FIG. 26 illustrates the cross section of a plasmonic collimator with its aperture partially covered by a piece of metal film.
Figure 27:
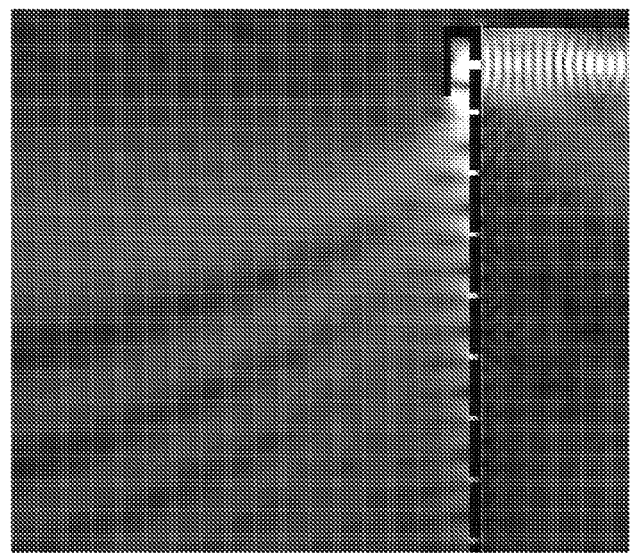
FIG. 27 illustrates the simulation result of the intensity distribution around the plasmonic collimator shown in FIG. 26. It is assumed that the laser wavelength is 9.9 μm and that there are 11 grating grooves (not all are shown in the figure).
Figure 28:
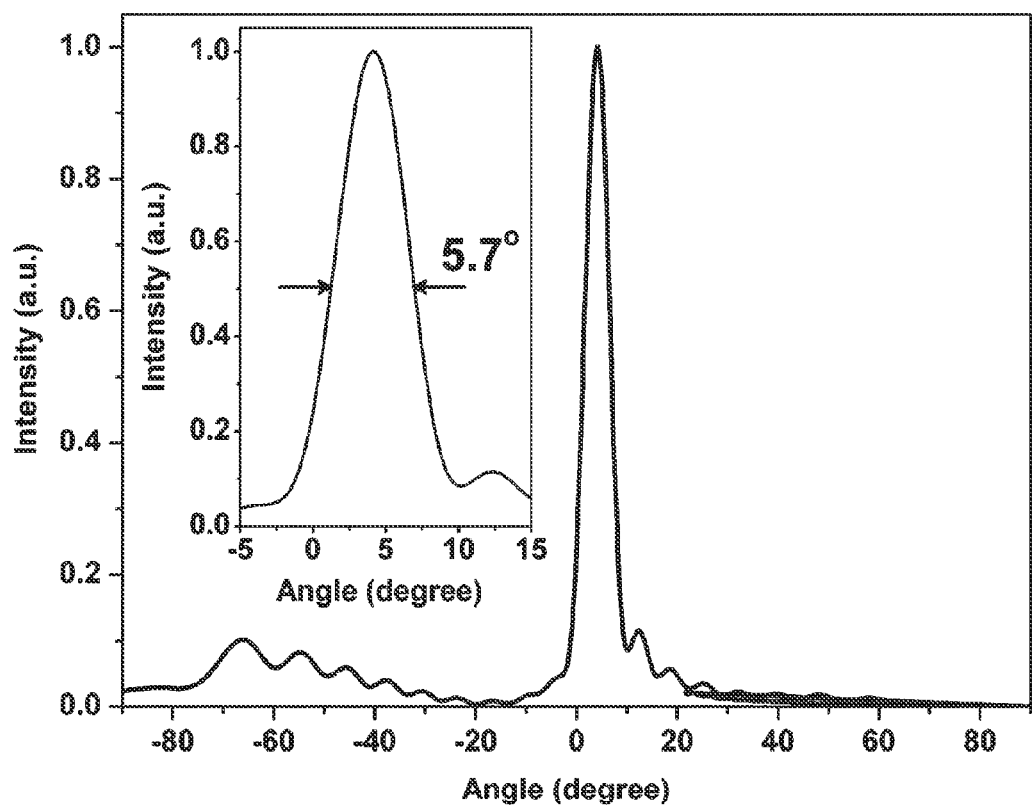
FIG. 28 illustrates the calculated vertical far-field intensity distribution for the structure simulated in FIG. 27. Inset is the zoom-in view of the central peak.

An alternative design with the aperture 14 partially covered by a metal film is shown in FIG. 26. In this embodiment, a transparent dielectric layer 48 formed, e.g., of alumina, silica, or chalcogenide glass, is positioned over the aperture 14. A metal film 46 is then positioned over the dielectric layer 48. The metal film 46 will transfer all the radiation from the aperture 14 into surface plasmons, which will propagate toward the grating grooves 16. A simulation of the intensity distribution for this structure is shown in FIG. 27 and the calculated far-field intensity distribution for the device is shown in FIG. 28. It is assumed that there are 11 grating grooves in the simulation and calculation.

Figure 29:
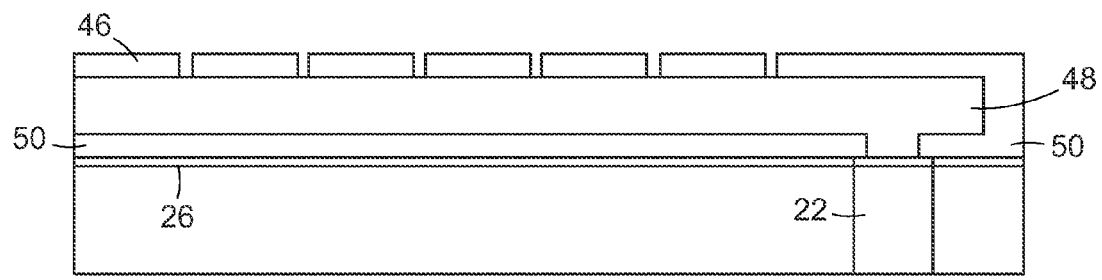
FIG. 29 illustrates the cross section of a plasmonic collimator with a double-metal waveguide. The outer metal layer is patterned with a slit aperture array.

An alternative design with a double-metal waveguide structure is shown in FIG. 29. In this embodiment, a transparent dielectric layer 48 formed, e.g., of alumina, silica, or chalcogenide glass, is positioned over the aperture 14 adjacent to the active region 22. The transparent dielectric layer 48 is sandwiched between an outer metal layer 46 and an inner metal layer 50. Light travels from the active region 22 through the aperture 14 into the transparent dielectric layer 48. Light exits the transparent dielectric layer 48 through a series of slit apertures 47 in the outer metal layer 46 and interfere constructively to produce a collimated light output, as in the other embodiments. The spacing between the slit apertures 47 is approximately equal to the wavelength of the metal-dielectric-metal waveguide mode. The exact spacing of the slit apertures and the width of the individual apertures can be further optimized with computer simulations similar to those performed for the single metal film plasmonic collimator. A simulation of the intensity distribution for this structure is shown in FIG. 30, and the calculated far-field intensity distribution for the device is shown in FIG. 31. It is assumed that there are 55 slit apertures in the simulation and calculation.

The double-metal waveguide structure in the last paragraph only collimates in one direction, because its outer metal layer 46 is patterned with a 1D slit aperture array 47. If instead the outer metal layer 46 is patterned with a 2D array of apertures 49 (e.g., rectangular apertures, circular apertures, ring apertures, C- or H-shaped apertures, spiral apertures, etc.), see FIG. 32, the structure is able to collimate in two dimensions. The spacing between the apertures 49 in the lateral and vertical directions is approximately equal to the wavelength of the metal-dielectric-metal waveguide mode.

EXPERIMENTAL

We use quantum cascade lasers as a model system to demonstrate plasmonic collimation. 1D plasmonic collimators were fabricated on ridge quantum cascade lasers. The ridge devices emit around $\lambda_o$=9.9 μm and were grown by molecular beam epitaxy. The ridge devices had 2.1-μm active-region thickness and various active-region widths.

The fabrication procedure started with focused ion beam milling of grating grooves in the indium phosphide substrate of quantum cascade lasers. Next, a 200-nm-thick alumina film was deposited onto the laser facet for electrical insulation using electron-beam evaporation, and a 600-nm-thick gold film was deposited using thermal evaporation. Multi-angle deposition was implemented such that the walls of the grooves were also covered by the alumina and gold film. Finally, focused ion beam milling was used a second time to open the aperture through the gold film in front of the laser active core. We chose a procedure in which grooves were cut into semiconductors before any deposition (FIG. 2)—instead of one in which a thick gold film is deposited first and the grooves are cut into it afterwards (FIG. 3)—because the focused ion beam mills smooth features in a semiconductor, while milling in a metal usually results in pronounced roughness due to large size of the crystallites in the metal.

To map the 2D far-field emission patterns of the devices, two motorized rotation stages were used. The tested devices were mounted on one of the rotation stages and could be rotated in the vertical plane. A mid-infrared mercury-cadmium-telluride detector was mounted on the other stage and could be scanned in the horizontal plane. The distance between the devices and the detector was kept constant at about 15 cm. Measurements were performed with a resolution of 0.25°. Power measurements were carried out with a calibrated power meter. The power meter, which had a metallic collection tube with a diameter of 6.5 mm, was placed within 2 mm of the lasers, thus collecting emitted power in an angular range of approximately ±60° with respect to the normal of the laser facet. A Fourier-transform infrared spectrometer was used for spectral measurements.

FIGS. 33 and 34 show, respectively, scanning electron microscope images of a $\lambda_o$=9.9 μm quantum cascade laser before and after patterning a 1D plasmonic collimator comprising a slit aperture and a grating with 24 grooves. The 2D far-field intensity distributions measured before and after patterning of the plasmonic structure are presented in FIGS. 35 and 36, respectively, demonstrating a strong reduction of the beam divergence in the vertical direction. The line scan of the 2D far-field emission patterns in the laser polarization direction (along the arrows in FIGS. 35 and 36) are provided in FIGS. 37 and 38, respectively, which show that the divergence angle (measured as full width at half maximum, where referenced herein) is reduced from about 63 degrees for the original device to about 2.4 degrees for the device with the 1D collimator. The line scans also show that the average intensity of the background of the device patterned with the collimator is less than 10% of the peak value of the central lobe. FIG. 39 shows the light output versus current characteristics before and after defining the 1D plasmonic collimator, demonstrating a maximum output power of about 100 mW. The slope efficiency of the light output versus current characteristics of the patterned devices is determined primarily by the efficiency of the plasmonic grating to couple surface plasmons into the free space. We found that larger slope efficiencies correlates with gratings with a larger number of grooves; the device with 24 grooves as shown in FIG. 34 has a slope efficiency of about 180 mWA$^{-1}$, which is about 90% of that of the original laser without a collimator.

2D plasmonic collimators were fabricated both on ridge quantum cascade lasers and on buried-heterostructure quantum cascade lasers. The ridge devices emit around $\lambda_o$=9.9 µm and were grown by molecular beam epitaxy; the buried-heterostructure devices emit around $\lambda_o$=8.06 µm and were grown by metal organic vapor-phase epitaxy. The ridge devices had 2.1-µm active-region thickness and various active-region widths. The active regions of all the buried heterostructure devices had a dimension of 2.1 µm and 9.7 µm in the vertical and lateral directions, respectively.

The fabrication procedure and far-field measurement setup were essentially the same for the 2D plasmonic collimation as those for the 1D plasmonic collimation.

A thorough study was performed for $\lambda_o$=8.06 µm buried-heterostructure quantum cascade lasers patterned with 2D plasmonic collimators. The original device with unpatterned facet (FIG. 40) had divergence angles of $\theta_\parallel$=42 degrees, $\theta_\perp$=74 degrees in the lateral and vertical directions, respectively (FIG. 41). A representative buried-heterostructure quantum cascade laser was patterned with a plasmonic collimator comprising 20 circular grooves and a 2.1×1.9 µm$^2$ aperture (FIG. 42). Compared to the unpatterned device, the laser patterned with the 2D collimator exhibited greatly reduced divergence angle (FIG. 43), wherein $\theta_\parallel$ and $\theta_\perp$ were equal to 3.7 degrees and 2.7 degrees, representing a reduction by a factor of about 10 and 30, respectively, in the lateral and the vertical directions compared to the original device.

Though the plasmonic collimator is designed for a single laser wavelength, e.g., $\lambda_o$=8.06 µm, the ring collimator design is robust with respect to laser spectral broadening. For instance, for the device patterned with 20 grating grooves discussed in the last paragraph, laser spectral width, $\Delta\lambda$, is approximately 0.1 µm at a driving current, $I_{dr}$=500 mA; $\Delta\lambda$ quickly increases to about 0.3 µm at $I_{dr}$=600 mA. We found that the measured far-field divergence angle was relatively stable at different driving currents. For instance, $\theta_\perp$ is equal to 2.6 and 2.7 degrees, while $\theta_\parallel$ stays at 3.7 degrees at $I_{dr}$=500 and 600 mA, respectively.

The lateral aperture size, $w_1$ (see definition in FIG. 6), of the above devices was stepwise increased using focused ion beam milling to investigate the impact of this parameter on $\theta_\perp$, $\theta_\parallel$ and the power output. The vertical aperture size, $w_2$=1.9 µm, remained constant. The slope efficiency for the devices increased as expected with increasing aperture width, leading to a higher maximum power (FIG. 44). At the same time the lateral divergence angle, $\theta_\parallel$, increased, while $\theta_\perp$ was nearly constant (Table 2). The behavior of $\theta_\parallel$ was due to the less efficient coupling to surface plasmons in the lateral direction as the lateral aperture size increases. For the widest aperture investigated in this work (8.1 µm), the maximum output power was more than 50% of that of the original unpatterned laser, while the divergence angles ($\theta_\perp$=2.4 degrees and $\theta_\parallel$=4.6 degrees) were still significantly reduced compared to the original unpatterned device. The dependence of the maximum power and the divergence angles on the lateral aperture size $w_1$ are summarized in Table 2.

TABLE 2

| | Device with 20 rings | |
|---|---|---|
| Aperture size $w_1 \times w_2$ (µm$^2$) | FWHM far-field divergence angles $\theta_\perp$, $\theta_\parallel$ (degrees) | Maximum power compared to the original laser |
| 2.8 × 1.9 | 2.7, 3.7 | 11% |
| 5.0 × 1.9 | 2.7, 3.7 | 37% |
| 8.1 × 1.9 | 2.4, 4.6 | 53% |

Ridge quantum cascade lasers can be easily processed compared with the buried-heterostructure quantum cascade lasers, which need regrowth of semi-insulating side cladding layers. It is therefore instructive to show that the 2D plasmonic collimator also works for devices with ridge waveguides. 2D collimation was successfully demonstrated on $\lambda_o$=9.9 µm ridge quantum cascade lasers, as shown in FIGS. 45 and 46. A simple scaling of the optimized design parameters for the $\lambda$=8.06 µm buried-heterostructure devices was found to give essentially the correct parameters for the ridge devices. A list of the optimized design parameters is summarized in Table 1. The experimental performance of this device was comparable to the performance obtained with buried-heterostructure devices with the same number of grooves; the divergence angles for the ridge device were $\theta_\perp$=5.0 degrees and $\theta_\parallel$=8.1 degrees for a device with 10 grating grooves.

In conclusion, the systematic experiments and simulations demonstrate that the integration of a suitably designed 1D or 2D plasmonic collimators on the facet of quantum cascade lasers reduces the beam divergence angles by more than a factor of 10 in either the vertical direction for 1D collimation or both the vertical and lateral directions for 2D collimation. The optimized devices preserve a high output power, comparable to that of the unpatterned lasers. The 2D plasmonic collimator design is herein shown to be applicable to both buried-heterostructure and ridge devices.

In describing embodiments of the invention, specific terminology is used for the sake of clarity. For purposes of description, each specific term is intended to at least include all technical and functional equivalents that operate in a similar manner to accomplish a similar purpose. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Further, where parameters for various properties are specified herein for embodiments of the invention, those parameters can be adjusted up or down by ¹⁄20th, ¹⁄10th, ⅕th, ⅓rd, ½, etc., or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention; further still, other aspects, functions and advantages are also within the scope of the invention. Additionally, steps, elements and features discussed herein in connection with one embodiment can likewise be used in conjunction with other embodiments. The contents of all references, including patents and patent applications, cited throughout this application are hereby incorporated by reference in their entirety. The appropriate components and methods of those references may be selected for the invention and embodiments thereof. Still further, the components and methods identified in the Background section are integral to this disclosure and can be used in conjunction with or substituted for components and methods described elsewhere in the disclosure within the scope of the invention.

We claim:

1. An apparatus for generating collimated radiation comprising:
   a radiation-emitting device including a facet of dielectric material, the radiation-emitting device defining a passage for radiation emission; and
   a metal film coated on the dielectric material, the metal film defining at least one aperture through which radiation emitted from the passage can pass and at which surface plasmons can be generated and a series of grooves incrementally spaced from the aperture, wherein the distance between the aperture and the nearest groove differs from the distance between successively spaced grooves, and wherein the grooves are configured to scatter surface plasmons to produce radiation reemissions such that the direct emission from the aperture and the radiation reemissions from the grooves constructively interfere to produce collimated radiation in the far field.

2. The apparatus of claim 1, wherein the grooves are spaced from the aperture such that the distance between each successively spaced groove is greater than the distance between preceding successively spaced grooves.

3. The apparatus of claim 1, wherein the series of grooves are provided on one side of the aperture, and at least one groove is provide on the opposite side of the aperture, wherein fewer grooves are provided on the opposite side of the aperture.

4. The apparatus of claim 1, wherein the metal film is coated on grooves in the dielectric substrate that provides the contour of the grooves in the metal film.

5. The apparatus of claim 4, wherein the metal film has a thickness at least as great as a skin depth to prevent penetration of electromagnetic radiation through the metal film.

6. The apparatus of claim 1, wherein the aperture extends along a non-straight path through the metal film.

7. The apparatus of claim 6, wherein the aperture has a substantially consistent width and traverses a path with turns through the metal film.

8. The apparatus of claim 7, wherein the aperture has a shape selected from the following: C-shaped, H-shaped and spiral-shaped.

9. The apparatus of claim 1, wherein the grooves are on a surface of the metal film facing away from the dielectric material.

10. The apparatus of claim 1, wherein the radiation-emitting device is selected from the following:
    a semiconductor laser;
    a light-emitting diode;
    an optical fiber;
    a fiber amplifier; and
    a fiber laser.

11. An apparatus for generating collimated radiation comprising:
    a radiation-emitting device including a facet of dielectric material, the radiation-emitting device defining a passage for radiation emission; and
    a metal film coated on the dielectric material, the metal film defining at least one aperture through which radiation emitted from the passage can pass and at which surface plasmons can be generated and a series of grooves, wherein the aperture has a substantially consistent width and traverses a path with turns through the metal film, and wherein the grooves are configured to scatter surface plasmons generated at the aperture to produce radiation reemissions, the direct emission from the aperture and the reemissions from the grooves constructively interfere to produce collimated radiation in the far field.

12. An apparatus for generating collimated radiation comprising:
    a radiation-emitting device including a facet of dielectric material, the radiation-emitting device defining a passage for radiation emission; and
    a metal film coated on the dielectric material, the metal film defining at least one aperture through which radiation emitted from the passage can pass and at which surface plasmons can be generated and a series of grooves on one side of the aperture and a fewer number of grooves on the other side of the aperture, and wherein the series of grooves are configured to scatter surface plasmons generated at the aperture to produce radiation reemissions, the direct emission from the aperture and the reemissions from the series of grooves constructively interfere to produce collimated radiation in the far field.

13. An apparatus for generating collimated radiation comprising:
    a radiation-emitting device including a facet of a first dielectric material, the radiation-emitting device defining a passage for radiation emission;
    a first metal film coated on the first dielectric material, the first metal film defining at least one aperture through which radiation emitted from the passage can pass;
    a transparent dielectric layer coated on the first metal film on the opposite side of the first metal film from the first dielectric material, wherein the emitted radiation can pass from the aperture in the first metal film through the transparent dielectric layer; and
    a second metal layer defining a one-dimensional grating of apertures or a two-dimensional aperture array through which the emitted radiation can pass from the transparent dielectric layer, wherein the apertures are spaced to allow a plurality of radiation emissions that constructively interfere to produce collimated radiation in the far field.

14. A method for generating collimated radiation comprising:
    generating radiation in a passage of a radiation-emitting device that is coated with a metal film, wherein the metal film defines an aperture for transmission of the radiation and a series of grooves incrementally spaced from the aperture, wherein the distance between the aperture and the nearest groove differs from the distance between successively spaced grooves; and
    passing the radiation through the aperture of the metal film, producing emitted radiation propagating from the aperture and surface plasmons across the grooves, the grooves scattering the surface plasmons to produce radiation reemissions such that the direct emission from the aperture and the radiation reemissions from the grooves constructively interfere to produce collimated radiation in the far field.

15. The method of claim 14, wherein the radiation emitted from the device has a full-width-at-half-maximum divergence of less than 10° either in one dimension perpendicular to the propagating direction of the emitted radiation or in a plane perpendicular to the propagating direction of the emitted radiation.

16. The method of claim 14, wherein the radiation emitted from the collimated device has a full-width-at-half-maximum divergence of less than 5° either in one dimension perpendicular to the propagating direction of the emitted radiation or in a plane perpendicular to the propagating direction of the emitted radiation.

17. The method of claim 14, wherein the grooves have a depth that creates resonant groove cavity modes for the surface plasmons.

18. The method of claim 14, wherein the radiation-emitting device emits radiation with a free-space wavelength, $\lambda_o$, and wherein the grooves have a width that is 20% of $\lambda_o$, or less.

19. The method of claim 14, wherein the series of grooves are positioned on one side of the aperture and at least one additional groove is provided on an opposite side of the aperture, the additional groove serving to reflect surface plasmons back across the aperture to the series of grooves.

* * * * *